(12) United States Patent
Lai et al.

(10) Patent No.: US 11,770,935 B2
(45) Date of Patent: Sep. 26, 2023

(54) 3D FERROELECTRIC MEMORY

(71) Applicant: Taiwan Semiconductor Manufacturing Company, Ltd., Hsin-Chu (TW)

(72) Inventors: Sheng-Chih Lai, Hsinchu County (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/854,701

(22) Filed: Jun. 30, 2022

(65) Prior Publication Data
US 2022/0336498 A1 Oct. 20, 2022

Related U.S. Application Data

(62) Division of application No. 16/903,545, filed on Jun. 17, 2020, now Pat. No. 11,411,025.
(Continued)

(51) Int. Cl.
*H01L 21/00* (2006.01)
*H10B 51/20* (2023.01)
(Continued)

(52) U.S. Cl.
CPC ........ *H10B 51/20* (2023.02); *H01L 29/40111* (2019.08); *H01L 29/6684* (2013.01);
(Continued)

(58) Field of Classification Search
CPC ... H10B 51/20; H10B 51/40; H01L 29/78391; H01L 29/40111; H01L 29/66666; H01L 29/6684; H01L 29/7827
See application file for complete search history.

(56) References Cited

U.S. PATENT DOCUMENTS 9,695,215 B2 7/2017 Montagner
9,935,114 B1 4/2018 Chavan et al.
(Continued)

OTHER PUBLICATIONS

Rad et al. "Ferroelectric Field Effect Transistors." Nanoelectronics and Information Technology, 387-403, ISBN: 978-3-527-40927-3, published May 2012.
(Continued)

*Primary Examiner* — Richard A Booth
(74) *Attorney, Agent, or Firm* — Eschweiler & Potashnik, LLC

(57) ABSTRACT

Various embodiments of the present disclosure are directed towards a metal-ferroelectric-insulator-semiconductor (MFIS) memory device, as well as a method for forming the MFIS memory device. According to some embodiments of the MFIS memory device, a lower source/drain region and an upper source/drain region are vertically stacked. A semiconductor channel overlies the lower source/drain region and underlies the upper source/drain region. The semiconductor channel extends from the lower source/drain region to the upper source/drain region. A control gate electrode extends along a sidewall of the semiconductor channel and further along individual sidewalls of the lower and upper source/drain regions. A gate dielectric layer and a ferroelectric layer separate the control gate electrode from the semiconductor channel and the lower and upper source/drain regions.

20 Claims, 34 Drawing Sheets

Related U.S. Application Data

(60) Provisional application No. 62/924,736, filed on Oct. 23, 2019.

(51) Int. Cl.
*H01L 29/78* (2006.01)
*H01L 21/28* (2006.01)
*H01L 29/66* (2006.01)
*H10B 51/30* (2023.01)
*H10B 51/40* (2023.01)

(52) U.S. Cl.
CPC .... *H01L 29/66666* (2013.01); *H01L 29/7827* (2013.01); *H01L 29/78391* (2014.09); *H10B 51/30* (2023.02); *H10B 51/40* (2023.02)

(56) References Cited

U.S. PATENT DOCUMENTS

| | | | |
|---|---|---|---|
| 10,153,018 | B2 | 12/2018 | Derner et al. |
| 10,403,631 | B1 | 9/2019 | Lu et al. |
| 10,978,473 | B2 | 4/2021 | Lai et al. |
| 11,037,952 | B2 | 6/2021 | Lai et al. |
| 11,605,633 | B2 * | 3/2023 | Chen .................. H01L 29/1079 |
| 11,637,126 | B2 * | 4/2023 | Wu ................... H01L 29/40111 257/295 |
| 2002/0109138 | A1 | 8/2002 | Forbes |
| 2004/0262635 | A1 | 12/2004 | Lee |
| 2014/0340952 | A1 | 11/2014 | Ramaswamy et al. |
| 2017/0076775 | A1 | 3/2017 | Mueller |
| 2017/0098660 | A1 | 4/2017 | Ramaswamy et al. |
| 2019/0074363 | A1 | 3/2019 | Zhu |
| 2020/0013791 | A1 | 1/2020 | Or-Bach et al. |

OTHER PUBLICATIONS

Non-Final Office Action dated Sep. 22, 2021 for U.S. Appl. No. 16/903,545.
Notice of Allowance dated Mar. 22, 2022 for U.S. Appl. No. 16/903,545.

* cited by examiner

3D FERROELECTRIC MEMORY

REFERENCE TO RELATED APPLICATIONS

This Application is a Divisional of U.S. application Ser. No. 16/903,545, filed on Jun. 17, 2020, which claims the benefit of U.S. Provisional Application No. 62/924,736, filed on Oct. 23, 2019. The contents of the above-referenced Patent Applications are hereby incorporated by reference in their entirety.

BACKGROUND

Two-dimensional (2D) memory arrays are prevalent in electronic devices and may include, for example, NOR flash memory arrays, NAND flash memory arrays, dynamic random-access memory (DRAM) arrays, and so on. However, 2D memory arrays are reaching scaling limits and are hence reaching limits on memory density. Three-dimensional (3D) memory arrays are a promising candidate for increasing memory density and may include, for example, 3D NAND flash memory arrays, 3D NOR flash memory arrays, and so on.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9A and 9B through FIGS. 18A and 18B illustrate a series of views of some embodiments of a method for forming an IC comprising a 3D memory array of MFIS memory cells.

FIGS. 20A and 20B through FIGS. 27A and 27B illustrate a series of views of some embodiments of a method for forming an IC comprising a 3D memory array of MFIS memory cells in which word lines are respectively at a bottom of the 3D memory array and a top of the 3D memory array.

DETAILED DESCRIPTION

Figures 1A, 1B:
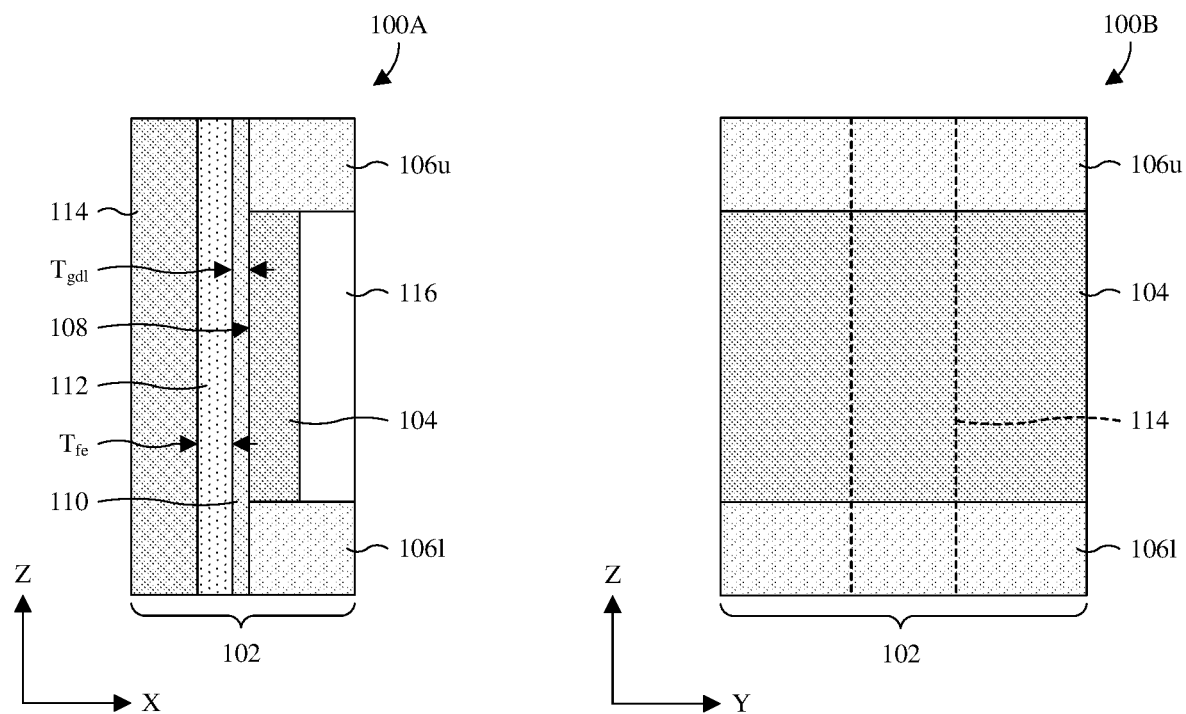
FIGS. 1A-1C illustrate various views of some embodiments of a MFIS memory cell.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some three-dimensional (3D) memory devices comprise a plurality of memory cells defining a plurality of memory arrays at different elevations above a substrate. According to some embodiments, a lower source/drain region, a semiconductor channel, and an upper source/drain region are vertically stacked and define a common sidewall. A control gate electrode and a data storage layer extend vertically through the plurality of memory arrays along the common sidewall. The data storage layer is between and borders the semiconductor channel and the control gate electrode. Further, the data storage layer comprises a silicon nitride layer separated from the control gate electrode and the semiconductor channel by silicon oxide.

During program and erase operations, electrons tunnel into or out of silicon nitride layer through silicon oxide, such that a bit of data may be represented by the amount of charge in the silicon nitride layer. A challenge is that program and erase operations are dependent upon high voltages for electron tunneling and hence for program and erase operations. Such high voltages may, for example, include voltages greater than about 10 volts or some other suitable voltage. Another challenge is that tunneling current is low and hence program and erase speeds are slow. Such slow speeds may, for example, be speeds greater than about 10 microseconds or some other suitable amount of time. Yet another challenge is that power consumption is high during program and erase operations due to the high voltages and also due to the slow speeds.

Various embodiments of the present disclosure are directed towards a metal-ferroelectric-insulator-semiconductor (MFIS) memory device and a method for forming the same. Note that although MFIS stands for metal ferroelectric insulator semiconductor, doped polysilicon and other suitable conductive materials may be used in place of metal. According to some embodiments of the MFIS memory device, a lower source/drain region and an upper source/drain region are vertically stacked. A semiconductor channel overlies the lower source/drain region and underlies the upper source/drain region. Further, the semiconductor channel extends from the lower source/drain region to the upper source/drain region. A control gate electrode extends along a sidewall of the semiconductor channel and further along individual sidewalls of the lower and upper source/drain regions. The control gate electrode is separated from the semiconductor channel and the lower and upper source/drain regions by a ferroelectric layer and a gate dielectric layer.

The ferroelectric layer has a polarity representing a bit of data. During a program operation, a program voltage is applied across the ferroelectric layer from the control gate electrode to the semiconductor channel to set the polarity to a programmed state. During an erase operation, an erase voltage is applied across the ferroelectric layer from the control gate electrode to the semiconductor channel to set the polarity to an erased state. By employing the ferroelectric layer for data storage, as opposed to a silicon nitride layer, there is no dependence on carrier tunneling. As such, program and erase voltages may be reduced and program and erase speeds may be increased. For example, program and erase voltages may be reduced to less than about 5 volts and/or program and erase speeds may be reduced to less than about 100 nanoseconds. Other suitable values are, however, amenable. By reducing the program and erase voltages and by increasing the program and erase speeds, power consumption may be reduced.

Figure 1C:
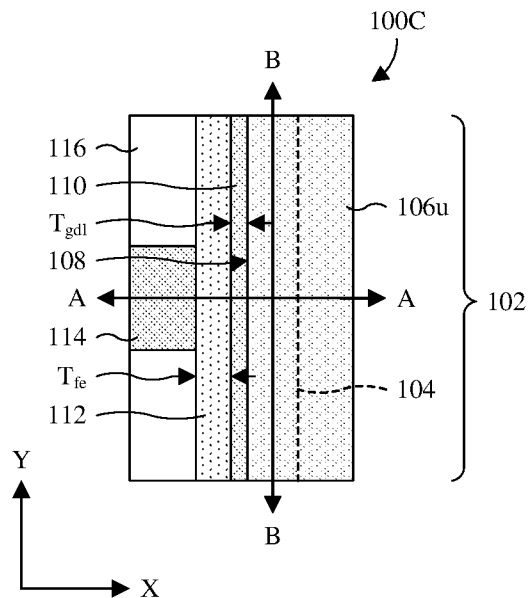

With reference to FIGS. 1A-1C, various views 100A-100C of some embodiments of a MFIS memory cell 102 is provided. FIG. 1A corresponds to a cross-sectional view 100A along line A in FIG. 1C, whereas FIG. 1B corresponds to a cross-sectional view 100B along line B in FIG. 1C. Further, FIG. 1C corresponds to a top view 100C. The MFIS memory cell 102 may, for example, be or comprise a MFIS field-effect transistor (FET) or some other suitable type of semiconductor device having an MFIS stack.

A semiconductor channel 104 overlies a lower source/drain region 106*l* and underlies an upper source/drain region 106*u*. The semiconductor channel 104, the lower source/drain region 106*l*, and the upper source/drain region 106*u* define a common sidewall 108 facing a gate dielectric layer 110, a ferroelectric layer 112, and a control gate electrode 114. In some embodiments, the common sidewall 108 is flat and/or smooth. The gate dielectric layer 110, the ferroelectric layer 112, and the control gate electrode 114 extend along the common sidewall 108 from the lower source/drain region 106*l* to the upper source/drain region 106*u*.

The gate dielectric layer 110 and the ferroelectric layer 112 separate the control gate electrode 114 from the common sidewall 108. The gate dielectric layer 110 is between the ferroelectric layer 112 and the common sidewall 108, and the ferroelectric layer 112 is between the control gate electrode 114 and the gate dielectric layer 110. Further, the ferroelectric layer 112 has a polarity representing a bit of data and is hence used for data storage.

During program and erase operations of the MFIS memory cell 102, the lower and upper source/drain regions 106*l*, 106*u* are electrically coupled in parallel and used as a proxy for the semiconductor channel 104. A program voltage is applied from the control gate electrode 114 to the semiconductor channel 104 (e.g., via the lower and upper source/drain regions 106*l*, 106*u*) to set the polarity to a programmed state. Further, an erase voltage having an opposite polarity as the program voltage is applied from the control gate electrode 114 to the semiconductor channel 104 (e.g., via the lower and upper source/drain regions 106*l*, 106*u*) to set the polarity to an erased state. The programmed state may, for example, represent a binary "1", whereas the erased state may, for example, represent a binary "0", or vice versa.

The ferroelectric layer 112 screens an electric field produced by the control gate electrode 114 differently depending whether the polarity is in the programmed state or the erased state. As such, the MFIS memory cell 102 has a programmed threshold voltage and an erased threshold voltage respectively while the polarity is in the programmed and erased states. During a read operation of the MFIS memory cell 102, the control gate electrode 114 is biased with a read voltage between the programmed and erased threshold voltages and the resistance of the semiconductor channel 104 is measured. Depending upon whether the semiconductor channel 104 conducts, the polarity is either in the programmed or erased state.

By using the ferroelectric layer 112 for data storage, as opposed to a silicon nitride layer, there is no dependence on carrier tunneling for the program and erase operations. As such, program and erase voltages may be reduced and program and erase speeds may be increased. For example, the program and erase voltages may be reduced to less than about 5 volts and/or program and erase speeds may be reduced to less than about 100 nanoseconds. Other suitable values are, however, amenable. By reducing the program and erase voltages and by increasing the program and erase speeds, power consumption may be reduced.

With continued reference to FIGS. 1A-1C, the semiconductor channel 104 extends from the lower source/drain region 106*l* to the upper source/drain region 106*u*. The semiconductor channel 104 may, for example, be doped or undoped and may, for example, be or comprise polysilicon and/or some other suitable semiconductor material(s). The semiconductor channel 104 may, for example, have a thickness (e.g., in an X direction) of about 10-30 nanometers, about 10-20 nanometers, about 20-30 nanometers, or some other suitable value.

The lower and upper source/drain regions 106*l*, 106*u* are doped and may, for example, be or comprise polysilicon and/or some other suitable semiconductor material(s). In some embodiments, the lower and upper source/drain regions 106*l*, 106*u* are or comprise doped polysilicon with a first doping type, and the semiconductor channel 104 is or comprises doped polysilicon with a second doping type opposite the first doping type. In some other embodiments, the lower and upper source/drain regions 106*l*, 106*u* are or comprise doped polysilicon, and the semiconductor channel 104 is or comprises undoped polysilicon.

The gate dielectric layer 110, the ferroelectric layer 112, and the control gate electrode 114 are at sides of the lower and upper source/drain regions 106*l*, 106*u*. As such, the gate dielectric layer 110, the ferroelectric layer 112, and the control gate electrode 114 are uncovered by the upper source/drain region 106*u*. The control gate electrode 114 may, for example, be or comprise titanium nitride, doped polysilicon (e.g., N+ or P+), tantalum nitride, tungsten, some other suitable conductive material(s), or any combination of the foregoing.

The gate dielectric layer 110 may, for example, be or comprise silicon oxide (e.g., $SiO_2$), aluminum oxide (e.g., Al$_2$O$_3$), silicon oxynitride (e.g., SiON), silicon nitride (e.g., Si$_3$N$_4$), lanthanum oxide (e.g., La$_2$O$_3$), strontium titanium oxide (e.g., SrTiO$_3$), undoped hafnium oxide (e.g., HfO$_2$), some other suitable dielectric(s), or any combination of the foregoing. In some embodiments, the gate dielectric layer 110 is or comprises a high k dielectric material having a dielectric constant greater than about 3.9, about 10, or some other suitable value. In some embodiments, the gate dielectric layer 110 has a dielectric constant of about 3.9-15, about 3.9-10, about 10-15, or some other suitable value. If the dielectric constant is too low (e.g., less than about 3.9 or some other suitable value), an electric field across the gate dielectric layer 110 may be high. The high electric field may lead to a high time-dependent dielectric breakdown (TDDB) and may hence reduce reliability of the gate dielectric layer 110.

In some embodiments, a thickness $T_{gdl}$ of the gate dielectric layer 110 (e.g., in an X direction) is less than about 2.5 nanometers or some other suitable value. In some embodiments, the thickness $T_{gdl}$ is about 1.5-2.5 nanometers, about 1.5-1.75 nanometers, about 1.75-2.5 nanometers, or some other suitable value. If the thickness $T_{gdl}$ is too small (e.g., less than about 1 nanometer or some other suitable value), leakage current may be high and hence data retention may be low. If the thickness $T_{gdl}$ is too large (e.g., greater than about 2.5 nanometers or some other suitable value), the program and erase voltages may be large and the memory window (e.g., a difference between the program and erase threshold voltages) may be small. The former leads to low power efficiency, whereas the latter leads to low reliability.

The ferroelectric layer 112 is in the orthorhombic phase and may, for example, be or comprise hafnium oxide (e.g., HfO$_2$) doped with: 1) aluminum to less than about 20 atomic percent; 2) silicon to less than about 5 atomic percent; 3) zirconium to less than about 50 atomic percent; 4) lanthanum to less than about 50 atomic percent; 5) strontium to less than about 50 atomic percent; or 6) some other suitable element. Other atomic percentages are, however, amenable. Additionally, or alternatively, the ferroelectric layer 112 may, for example, be or comprise some other suitable ferroelectric material(s). In some embodiments, a dielectric constant of the ferroelectric layer 112 is greater than that of the gate dielectric layer 110.

In some embodiments, a thickness $T_{fe}$ of the ferroelectric layer 112 (e.g., in an X direction) is less than about 15 nanometers or some other suitable value. In some embodiments, the thickness $T_{gdl}$ is about 5-15 nanometers, about 5-10 nanometers, about 10-15 nanometers, or some other suitable value. If the thickness $T_{fe}$ is too small (e.g., less than about 5 nanometer or some other suitable value), the polarity may weekly switch between the programmed and erased states during the program and erase operations. As a result, reliability may be low. If the thickness $T_{fe}$ is too large (e.g., greater than about 15 nanometers or some other suitable value), the program and erase voltages may be large and hence power efficiency may be low.

A dielectric structure 116 surrounds the MFIS memory cell 102. The dielectric structure 116 separates the lower and upper source/drain regions 106l, 106u from each other and, as seen hereafter, separates the MFIS memory cell 102 from other MFIS memory cells when the MFIS memory cell 102 is integrated into a memory array. Note that a portion of the dielectric structure 116 separating the lower and upper source/drain regions 106l, 106u may also be known as a source/drain dielectric layer. The dielectric structure 116 may be or comprise, for example, silicon oxide and/or some other suitable dielectric(s).

Figure 2A:
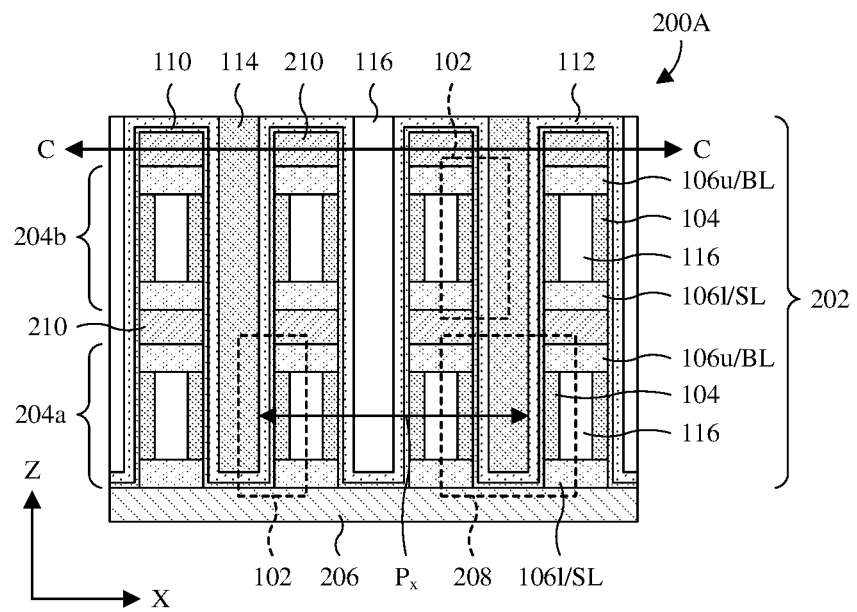
FIGS. 2A-2D illustrate various views of some embodiments of a three-dimensional (3D) memory array comprising MFIS memory cells configured as in FIGS. 1A-1C.
Figure 2B:
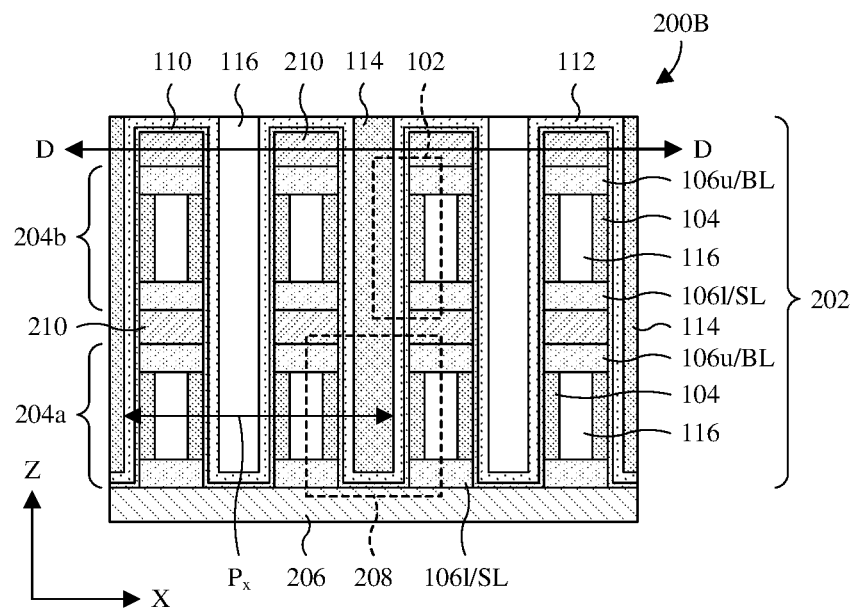
Figure 2C:
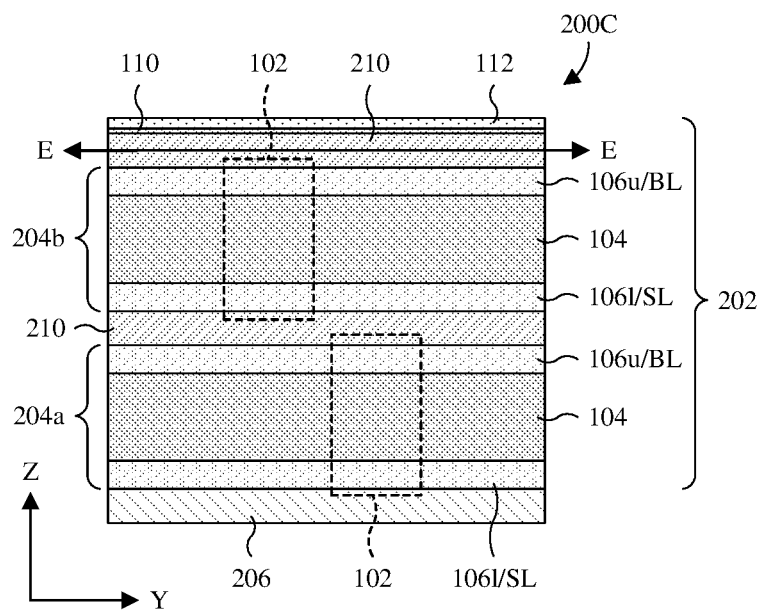
Figure 2D:
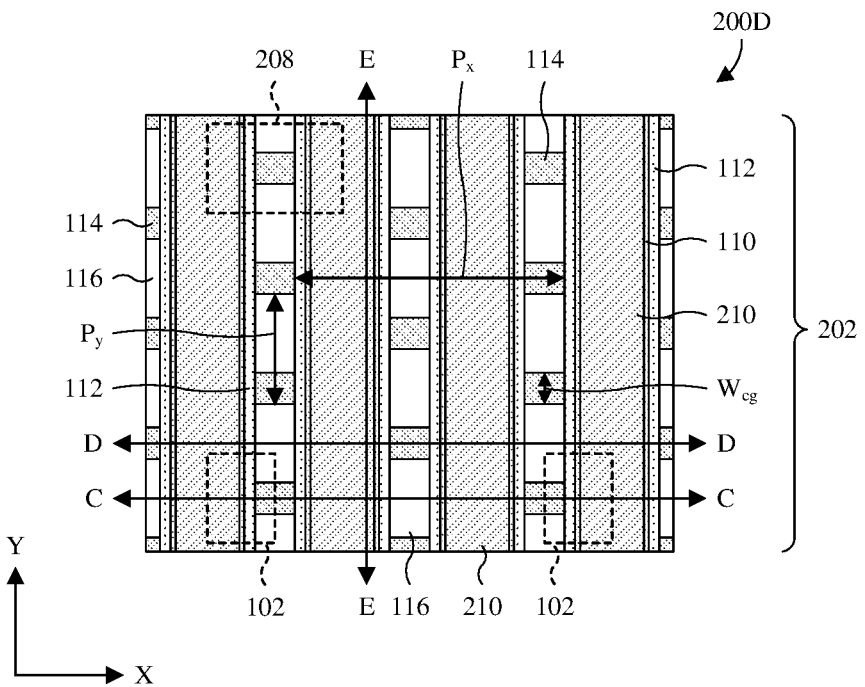

With reference to FIGS. 2A-2D, various views 200A-200D of some embodiments of a 3D memory array 202 comprising a plurality of MFIS memory cells 102 configured as in FIGS. 1A-1C is provided. FIG. 2A corresponds to a cross-sectional view 200A along line C in FIG. 2D. FIG. 2B corresponds to a cross-sectional view 200B along line D in FIG. 2D. FIG. 2C corresponds to a cross-sectional view 200C along line E in FIG. 2D. FIG. 2D corresponds to a top view 200D along lines C-E respectively in FIGS. 2A-2C. The 3D memory array 202 may, for example, provide high memory density, as well as high reliability (e.g., high endurance and high retention) for high speed and low power consumption applications.

The MFIS memory cells 102 are grouped into a first memory array 204a and a second memory array 204b. The first and second memory arrays 204a, 204b are vertically stacked over a dielectric substrate 206, and the second memory array 204b overlies the first memory array 204a. The first and second memory arrays 204a, 204b have the same layout and each has 9 rows and 8 columns (best seen in FIG. 2D). In alternative embodiments, the first and second memory arrays 204a, 204b have more or less rows and/or more or less columns. For readability, the rows and the columns are not labeled. However, it is to be appreciated that the rows extend in an X direction (e.g., laterally in the cross-sectional views 200A, 200B of FIGS. 2A and 2B), whereas the columns extend in a Y direction (e.g., laterally in the cross-sectional view 200C of FIG. 2C).

A plurality of control gate electrodes 114, a ferroelectric layer 112, and a gate dielectric layer 110 extend through the first and second memory arrays 204a, 204b and partially define the MFIS memory cells 102. The control gate electrodes 114 are shared by MFIS memory cells in the first memory array 204a and MFIS memory cells in the second memory array 204b. For example, each MFIS memory cell in the first memory array 204a may share a control gate electrode with an overlying MFIS memory cell in the second memory array 204b. Similarly, the ferroelectric layer 112 and the gate dielectric layer 110 are shared by MFIS memory cells in the first memory array 204a and MFIS memory cells in the second memory array 204b. The ferroelectric layer 112 may, for example, be shared because polarization of the ferroelectric layer 112 may be localized to a MFIS memory cell at which the polarization occurred.

The MFIS memory cells 102 are further grouped into pairs 208 of neighboring MFIS memory cells (e.g., MFIS pairs 208) along corresponding rows. The MFIS memory cells in each of the MFIS pairs 208 share a corresponding one of the control gate electrodes 114. A MFIS memory cell on a right side of a corresponding control gate electrode is as illustrated and described in FIGS. 1A-1C. A MFIS memory cell on a left side of a corresponding control gate electrode is as illustrated and described in FIGS. 1A-1C, except that FIGS. 1A and 1C should be flipped horizontally respectively along the Z axis and the Y axis. FIG. 1B is the same regardless of whether an MFIS memory cell is on a left or right side of a corresponding control gate electrode.

The MFIS pairs 208 are arranged so an MFIS pair occurs every two columns along each row and occurs every other row along each column. Further, the MFIS pairs 208 are staggered along neighboring columns and neighboring rows so a pitch $P_y$ of the MFIS pairs 208 in a Y direction spans a row and a pitch $P_x$ of the MFIS pairs 208 in an X direction spans two columns. In some embodiments, the control gate electrodes 114 have individual widths $W_{cg}$ in the Y direction that are less than about half the Y-direction pitch $P_y$.

A plurality of semiconductor channels 104, a plurality of lower source/drain regions 106*l*, and a plurality of upper source/drain regions 106*u* also partially define the MFIS memory cells 102. Note that "lower" and "upper" are relative to the corresponding MFIS memory cells 102 of the lower and upper source/drain regions 106*l*, 106*u*. The semiconductor channels 104 extend correspondingly along the columns and are shared by the MFIS memory cells in the corresponding columns. A semiconductor channel may, for example, be shared by multiple MFIS memory cells because an electric field produced by an MFIS memory cell is localized to the MFIS memory cell. In alternative embodiments, the semiconductor channels 104 are individual to the MFIS memory cells 102 and are hence not shared. Similar to the semiconductor channels 104, the lower and upper source/drain regions 106*l*, 106*u* extend correspondingly along the columns and are shared by the MFIS memory cells in the corresponding columns. Further, the upper source/drain regions 106*u* define bit lines BL, and the lower source/drain regions 106*l* define source lines SL. In alternative embodiments, the upper source/drain regions 106*u* define the source lines SL, and the lower source/drain regions 106*l* define the bit lines BL.

A plurality of array dielectric layers 210 and a dielectric structure 116 surround the first and second memory arrays 204*a*, 204*b*. The array dielectric layers 210 are individual to the first and second memory arrays 204*a*, 204*b* and are each atop the upper source/drain region 106*u* of the individual memory array. The array dielectric layers 210 are a different material than the dielectric substrate 206 and may, for example, be or comprise silicon nitride and/or some other suitable dielectric(s). The dielectric structure 116 is along sidewalls of the MFIS memory cells 102 to laterally separate the MFIS memory cells 102 from each other.

While FIGS. 2A-2D illustrate a 3D memory array with two memory-array levels, more memory-array levels are amenable. For example, the second memory array 204*b* along with its corresponding one of the array dielectric layers 210 may be repeated above the second memory array 204*b*. Further, while FIGS. 2A-2D illustrate a 3D memory array with two memory-array levels, a two-dimensional (2D) memory array with a single memory-array level is also amenable. For example, the second memory array 204*b* along with its corresponding one of the array dielectric layers 210 may be omitted.

Figure 3A:
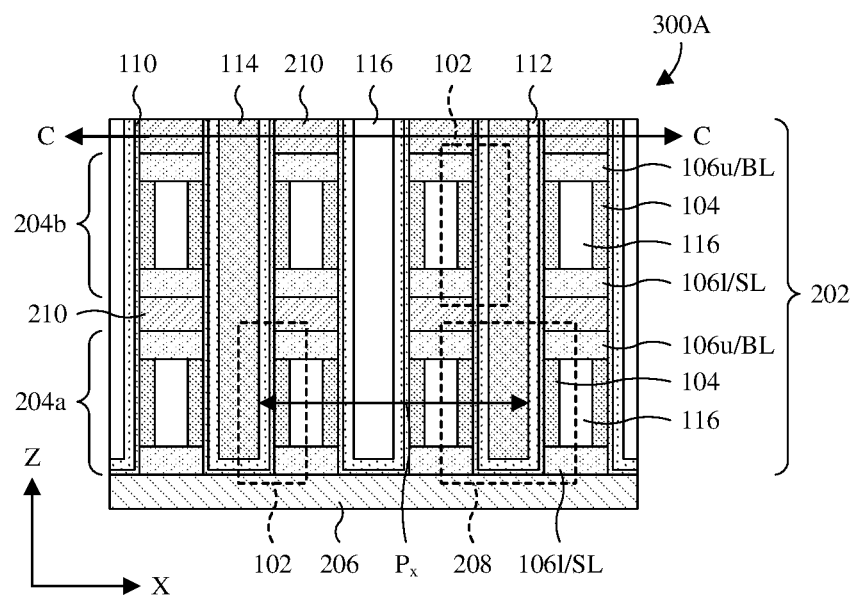
FIGS. 3A-3G illustrate cross-sectional views of various alternative embodiments of the 3D memory array of FIG. 2A in which constituents of the 3D memory array are varied.

With reference to FIG. 3A, a cross-sectional view 300A of some alternative embodiments of the 3D memory array 202 of FIG. 2A is provided in which the 3D memory array 202 is uncovered by the gate dielectric layer 110 and the ferroelectric layer 112. As a result, the gate dielectric layer 110 comprises a plurality of discrete gate dielectric segments, and the ferroelectric layer 112 comprises a plurality of discrete ferroelectric segments. The gate dielectric segments and the ferroelectric segments are shared by the first and second memory arrays 204*a*, 204*b* and have U-shaped profiles. In alternative embodiments, the gate dielectric segments and/or the ferroelectric segments have other suitable profiles. Further, the gate dielectric segments and the ferroelectric segments alternate with the lower and upper source/drain regions 106*l*, 106*u* along the rows. As in FIGS. 2A-2D, rows extend in an X direction.

Figure 3B:
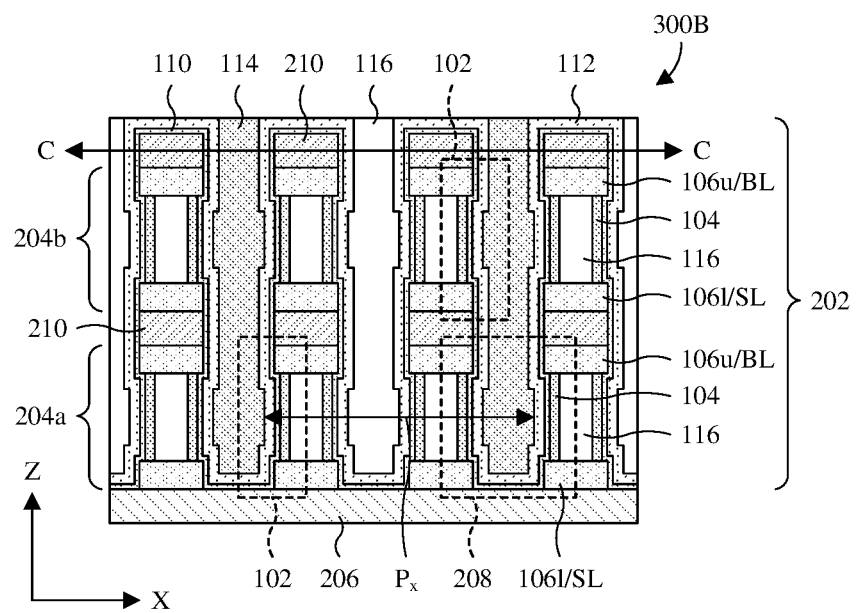
Figure 3C:
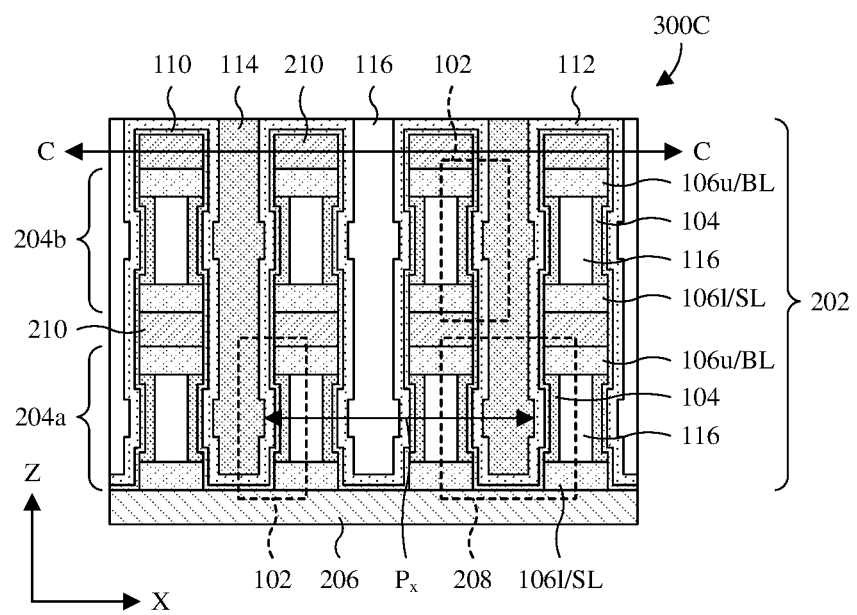

With reference to FIGS. 3B and 3C, cross-sectional views 300B, 300C of some alternative embodiments of the 3D memory array 202 of FIG. 2A are provided in which the control gate electrodes 114 and the dielectric structure 116 bulge at the semiconductor channels 104. Further, the gate dielectric layer 110 and the ferroelectric layer 112 wrap around sides of the bulges. In FIG. 3B, the semiconductor channels 104 have rectangular profiles and are set back from sidewalls of the lower and upper source/drain regions 106*l*, 106*u*. In FIG. 3C, the semiconductor channels 104 respectively have C-shaped and reverse C-shaped profiles. In alternative embodiments, the semiconductor channels 104 have other suitable profiles.

Figure 3D:
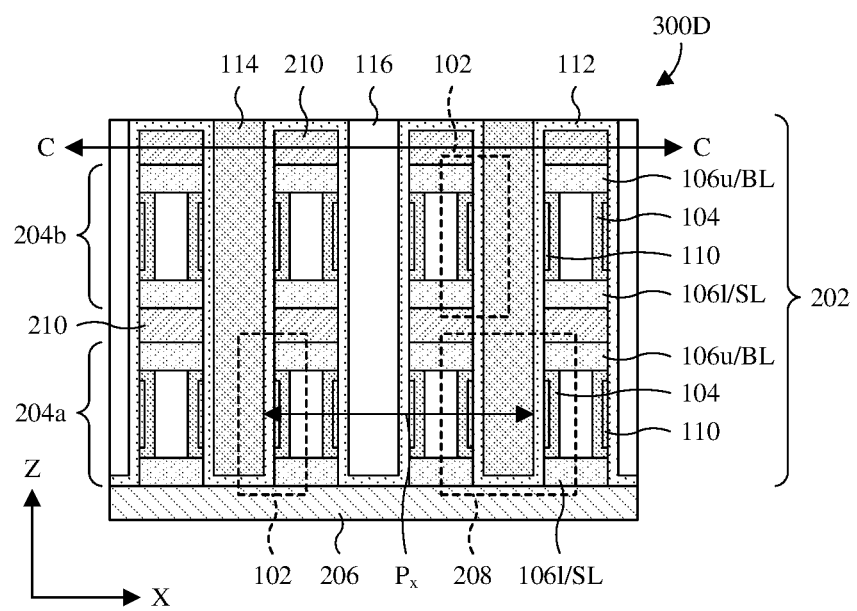
Figure 3E:
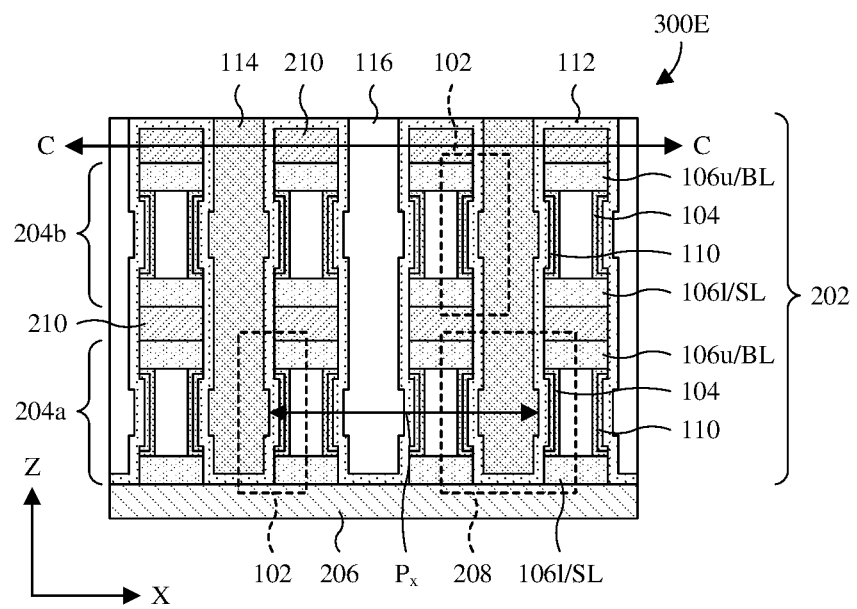
Figure 3F:
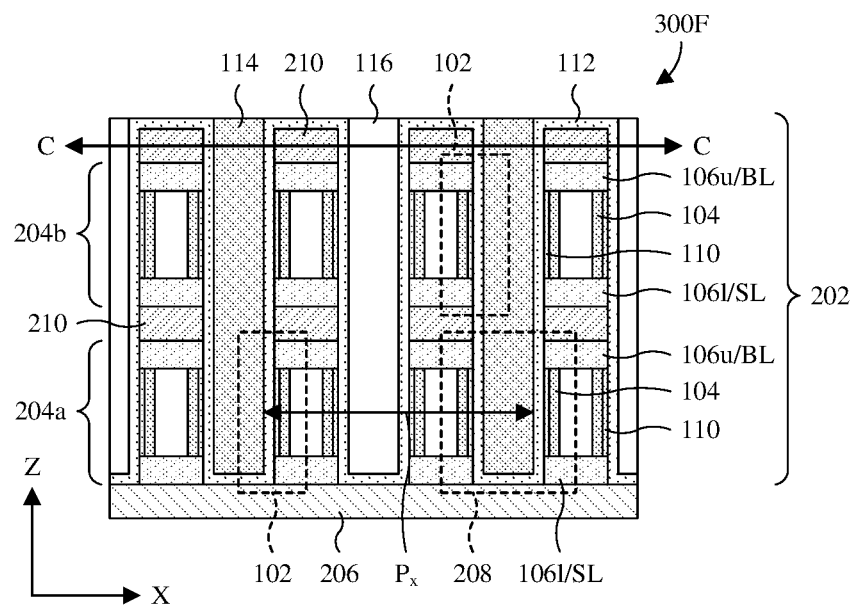

With reference to FIGS. 3D-3F, cross-sectional views 300D-300F of some alternative embodiments of the 3D memory array 202 of FIG. 2A are provided in which the gate dielectric layer 110 comprises a plurality of discrete gate dielectric segments respectively underlying the upper source/drain regions 106*u*. In FIGS. 3D and 3E, the semiconductor channels 104 respectively have C-shaped and reverse C-shaped profiles that respectively wrap around sides of the gate dielectric segments. In FIG. 3E, the control gate electrodes 114 and the dielectric structure 116 further bulge at the gate dielectric segments and the gate dielectric segments respectively have C-shaped and reverse C-shaped profiles respectively wrapping around sides of the bulges. In FIG. 3F, the semiconductor channels 104 have rectangular profiles and hence do not wrap around sides of the gate dielectric segments. In alternative embodiments, the semiconductor channels 104 and/or the gate dielectric segments have other suitable profiles.

Figure 3G:
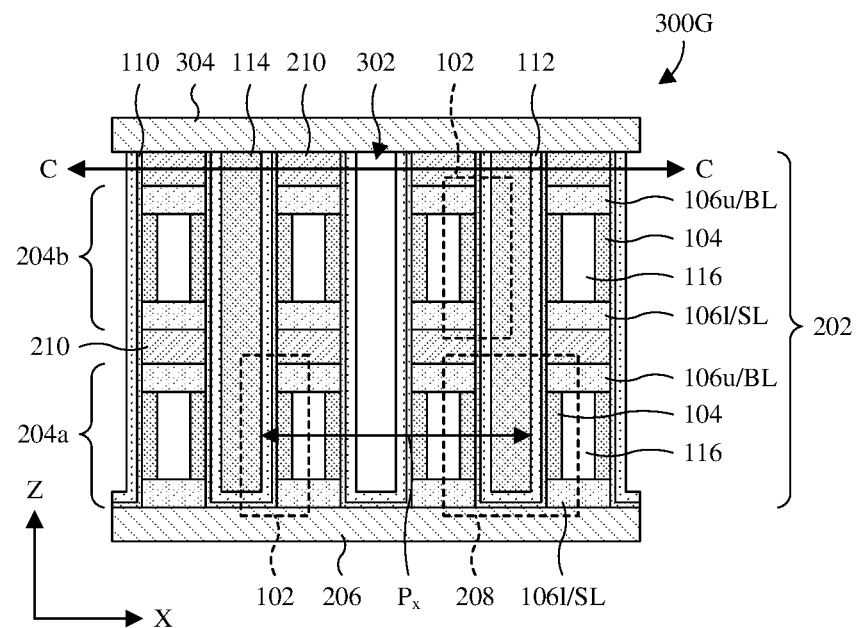

With reference to FIG. 3G, a cross-sectional view 300G of some alternative embodiments of the 3D memory array 202 of FIG. 2A is provided in which cavities 302 separate the control gate electrodes 114 from each other instead of the dielectric structure 116. The cavities 302 include air and/or some other suitable gas(es). Further, the cavities 302 are sealed by a seal dielectric layer 304. The seal dielectric layer 304 covers the 3D memory array 202 and the cavities 302 and may, for example, be or comprise silicon oxide and/or some other suitable dielectric(s).

While FIGS. 3A-3G illustrate cross-sectional views 300A-300G of some alternative embodiments of FIG. 2A in which constituents are modified, it is to be appreciated that the modifications may also be applied to any of FIGS. 2B-2D. For example, when applying the modifications of FIG. 3A to FIGS. 2B-2D, the gate dielectric layer 110 and the ferroelectric layer 112 may be cleared from atop the array dielectric layer 210 of the second memory array 204*b* in FIGS. 2B and 2C. FIG. 2D may be remain unchanged. While FIG. 2D is described with regard to FIGS. 2A-2C, any of FIGS. 3A-3G may be taken along line C in embodiments of FIG. 2D which have been modified as necessary as described above. For example, FIG. 3G may be taken along line C in alternative embodiments of FIG. 2D in which the dielectric structure 116 has been replaced with the cavities 302. As another example, FIGS. 3A-3C may be taken along line C in the embodiments of FIG. 2D without modification of FIG. 2D.

Figure 4A:
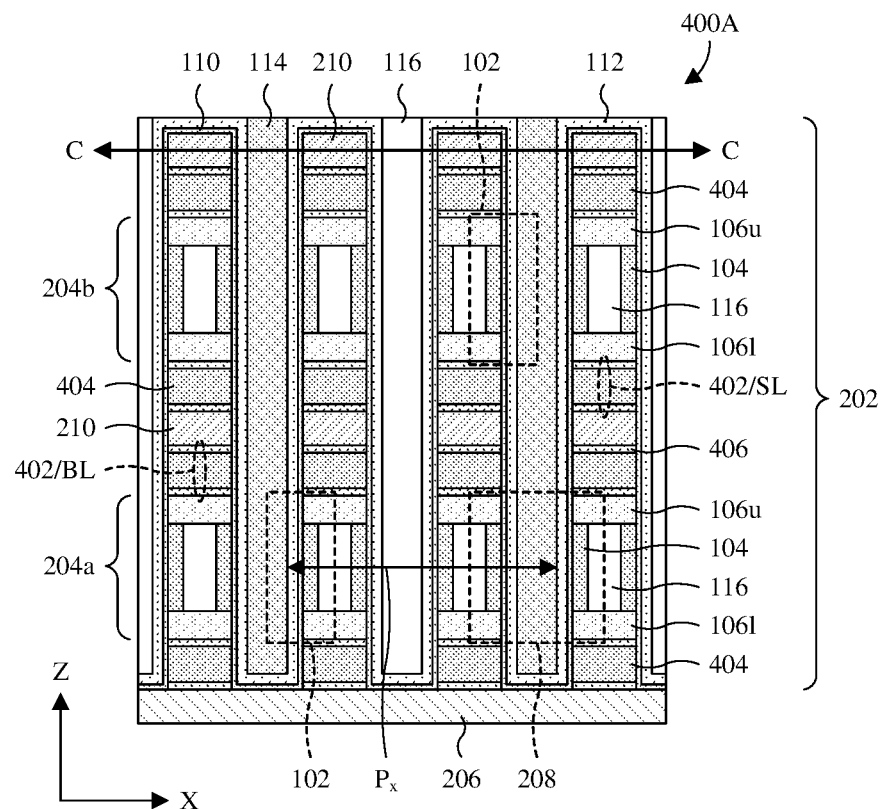
FIGS. 4A-4D illustrate cross-sectional views of various alternative embodiments of the 3D memory array of FIG. 2A in which conductive lines comprising metal define source lines and bit lines.

With reference to FIG. 4A, a cross-sectional view 400A of some alternative embodiments of the 3D memory array of FIG. 2A is provided in which a plurality of metal lines 402 define the source lines SL and the bit lines BL instead of the lower and upper source/drain regions 106*l*, 106*u*. The metal lines 402 extend correspondingly along the columns. Further, the metal lines 402 are individual to the lower and upper source/drain regions 106*l*, 106*u* and electrically couple directly to the individual source/drain regions. In the case of the upper source/drain regions 106*u*, the upper source/drain regions 106*u* underlie and directly contact the corresponding metal lines. In the case of the lower source/drain regions 106*l*, the lower source/drain regions 106*l* overlie and directly contact the corresponding metal lines.

The metal lines 402 have smaller resistances than the lower and upper source/drain regions 106*l*, 106*u* and hence reduce voltage drops along the source lines SL and the bit lines BL. The reduce voltage drops allow larger memory arrays and/or reduced power consumption. The metal lines 402 comprise corresponding metal layers 404 and corresponding barrier layers 406. The barrier layers 406 are configured to prevent outward diffusion of material from the metal layers 404 to overlying structure and/or underlying structure. The metal layers 404 may, for example, be or comprise tungsten and/or some other suitable metal(s). The barrier layers 406 may, for example, be or comprise titanium nitride (e.g., TiN), tungsten nitride (e.g., WN), some other suitable barrier material(s), or any combination of the foregoing.

Figure 4B:
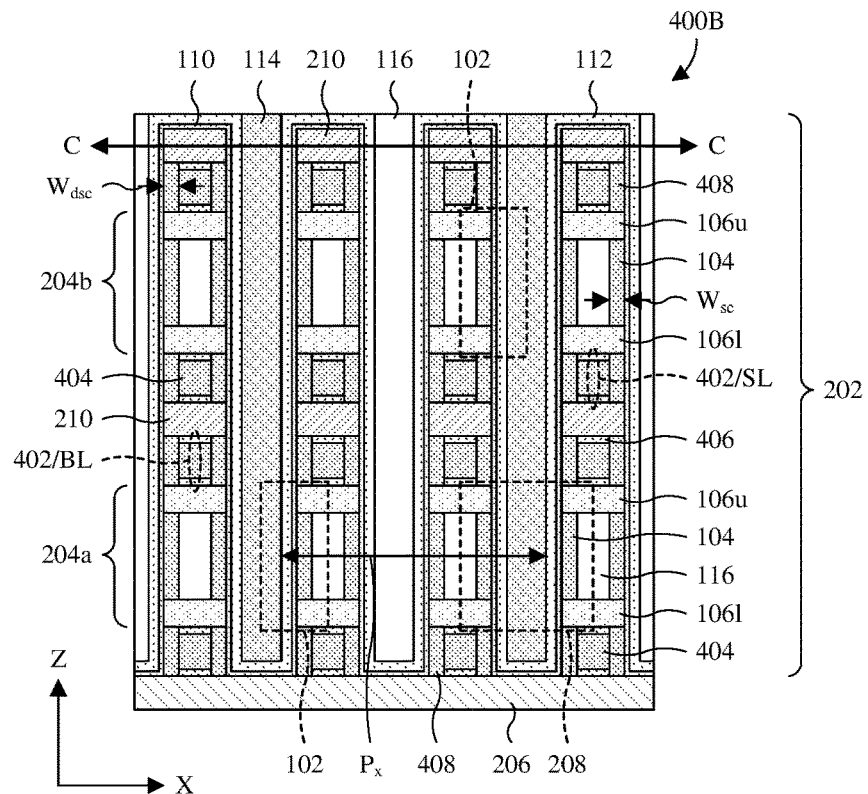

With reference to FIG. 4B, a cross-sectional view 400B of some alternative embodiments of 3D memory array of FIG. 4A is provided in which dummy semiconductor channels 408 are on sidewalls of the metal lines 402 to protect the metal lines 402 from oxidation. Such oxidation may, for example, occur before and/or during deposition of the gate dielectric layer 110 and the ferroelectric layer 112. Oxidation may increase resistances of the metal lines 402, thereby increasing voltage drops along the metal lines 402. This may, in turn, increase power consumption and/or limit the size of the 3D memory array 202. The dummy semiconductor channels 408 are respectively as the semiconductor channels 104 are described. This may, for example, be due to formation by the same process or a similar process.

In some embodiments, the dummy semiconductor channels 408 have individual widths $W_{dsc}$ that are the same as or substantially the same as individual widths $W_{sc}$ of the semiconductor channels 104. In alternative embodiments, the dummy semiconductor channels 408 have individual widths $W_{dsc}$ that are different (e.g., greater or less) than the individual widths $W_{sc}$ of the semiconductor channels 104. The different widths may, for example, be due to different etch processes while forming recesses within which the dummy semiconductor channels 408 and the semiconductor channels 104 are formed and/or may, for example, be due to different etch rates while forming the recesses. Other suitable reasons are, however, amenable.

Figure 4C:
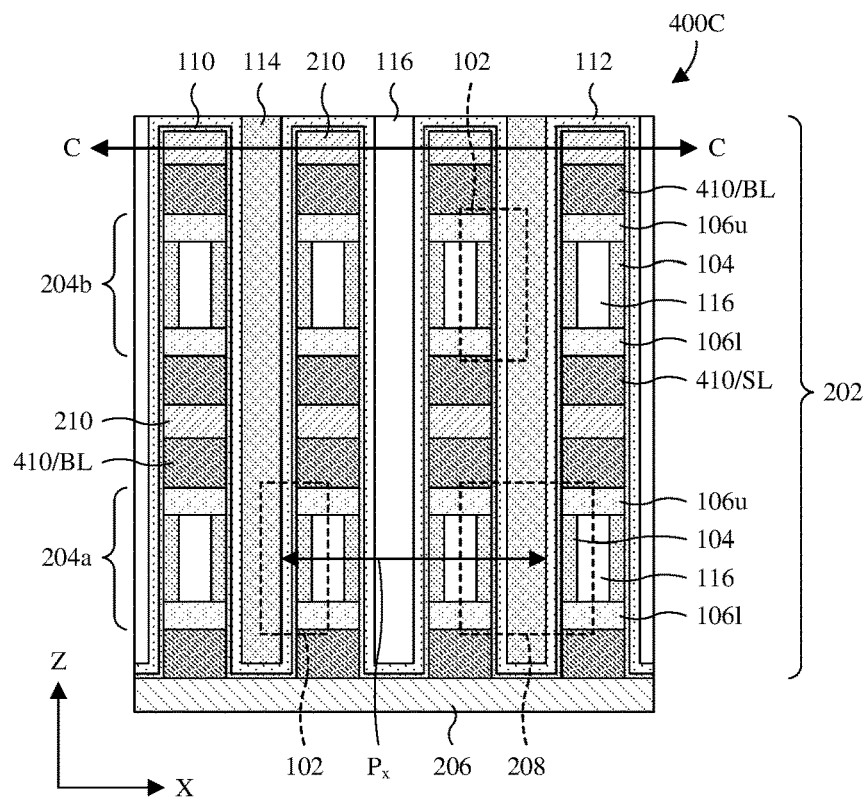

With reference to FIG. 4C, a cross-sectional view 400C of some alternative embodiments of the 3D memory array of FIG. 2A is provided in which a plurality of silicide lines 410 are used in place of the plurality of metal lines 402. Hence, the source lines SL and the bit lines BL are defined by the silicide lines 410. The silicide lines 410 are a metal silicide and may, for example, be or comprise nickel silicide or some other suitable metal silicide.

As discussed with regard to FIG. 4B, oxidation of the metal lines 402 may occur without dummy semiconductor channels 408 protecting sidewalls of the metal lines 402. Such oxidation may, in turn, negatively impact performance of the 3D memory array 202. The silicide lines 410 may have a comparable resistance to the metal lines 402 and may hence perform comparable to the metal lines 402. Further, the silicide lines 410 may have a lower reactivity to oxygen than the metal lines 402. Therefore, by replacing the metal lines 402 with the silicide lines 410, the challenges associated with oxidation may be mitigated without the dummy semiconductor channels 408. The dummy semiconductor channels 408 may add complexity to formation of the 3D memory array 202, such that omitting the dummy semiconductor channels 408 may reduce costs and/or increase yields.

Figure 4D:
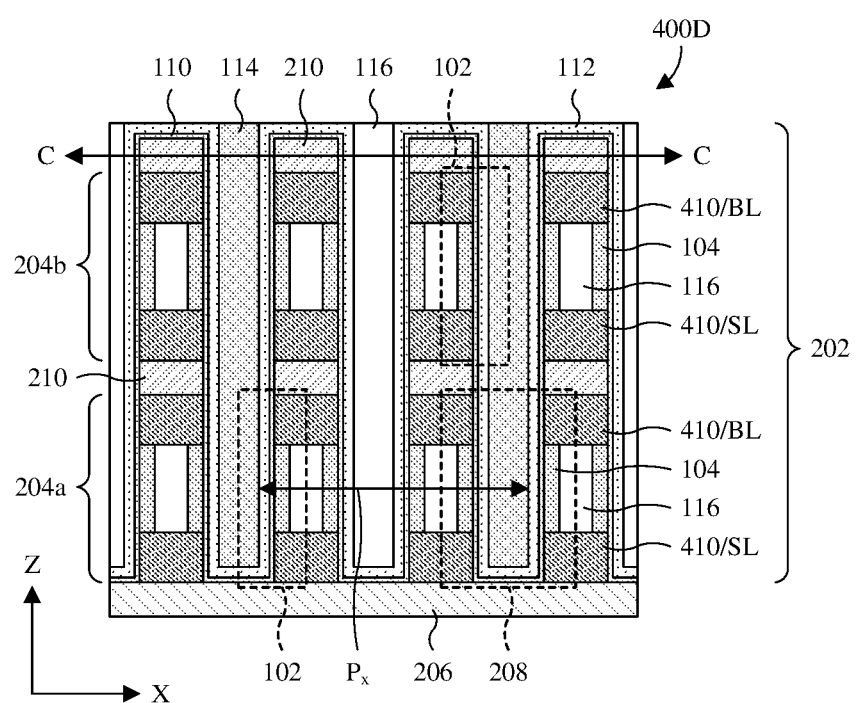

With reference to FIG. 4D, a cross-sectional view 400D of some alternative embodiments of the 3D memory array of FIG. 4C is provided in which the lower and upper source/drain regions 106*l*, 106*u* are omitted. Instead, the silicide lines 410 are used as source/drain regions for the MFIS memory cells 102.

While FIGS. 4A-4D illustrate cross-sectional views 400A-400D of some alternative embodiments of the 3D memory array of FIG. 2A in an X direction, it is to be appreciated that top views of the alternative embodiments may be as illustrated in FIG. 2D. For example, FIG. 2D may be taken along line C in any one of the FIGS. 4A-4D. Similarly, it is to be appreciated that cross-sectional views of the alternative embodiments in a Y direction may be as illustrated in FIG. 2C, except that the vertical stacks of layers would be modified to match FIGS. 4A-4D.

Figures 5A, 5B:
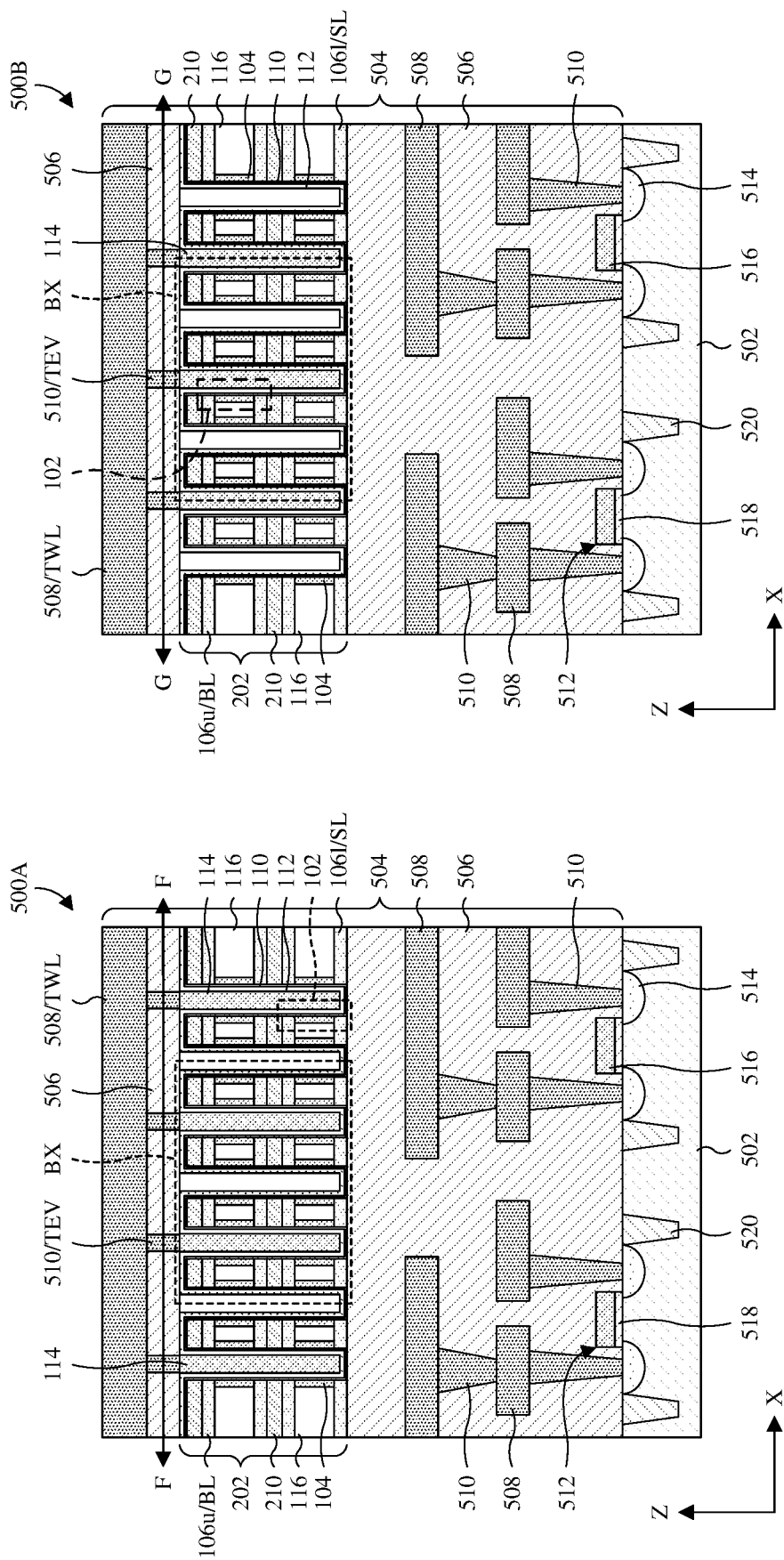
FIGS. 5A-5C illustrate various views of some embodiments of an integrated circuit (IC) comprising a 3D memory array.
Figure 5C:
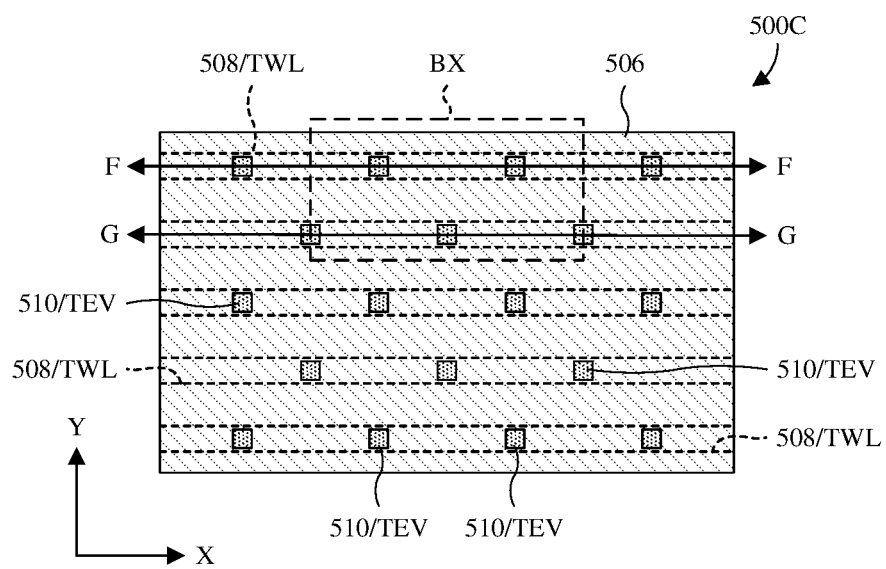

With reference to FIGS. 5A-5C, various views 500A-500C of some embodiments of an integrated circuit (IC) comprising a 3D memory array 202 is provided. The 3D memory array 202 is as described at FIGS. 2A-2D and includes additional columns. In alternative embodiments, the 3D memory array 202 is as described at any of FIGS. 3A-3G and 4A-4D and further includes the additional columns. FIG. 5A corresponds to a cross-sectional view 500A along line F in FIG. 5C, and FIG. 5B corresponds to a cross-sectional view 500B along line G in FIG. 5C. Further, FIG. 5C corresponds to lines F and G respectively in FIGS. 5A and 5B.

The 3D memory array 202 overlies a semiconductor substrate 502 within an interconnect structure 504. The semiconductor substrate 502 may, for example, be or comprise a bulk substrate of monocrystalline silicon and/or some other suitable type of semiconductor substrate. The interconnect structure 504 comprises an interconnect dielectric layer 506, a plurality of wires 508, and a plurality of vias 510. The wires 508 and the vias 510 are alternatingly stacked in the interconnect dielectric layer 506 to define conductive paths over and under the 3D memory array 202. The interconnect dielectric layer 506 may, for example, be or comprise silicon oxide and/or some other suitable dielectric(s). The wires 508 and the vias 510 may, for example, be or comprise metal and/or some other suitable conductive material(s).

The plurality of wires 508 define top word line wires TWL (shown in phantom in FIG. 5C) overlying the 3D memory array 202 and extending correspondingly along the rows of the 3D memory array 202. Further, the plurality of vias 510 define top electrode vias TEV extending respectively from the control gate electrodes 114 respectively to the top word lines TWL. Hence, the top word lines TWL and the top electrode vias TEV electrically couple to and interconnect control gate electrodes in corresponding rows.

Semiconductor devices 512 are on the semiconductor substrate 502, between the semiconductor substrate 502 and the interconnect structure 504. The semiconductor devices 512 comprise corresponding pairs of source/drain regions 514, corresponding gate electrodes 516, and corresponding gate dielectric layers 518. The gate electrodes 516 correspond to the pairs of source/drain regions 514 and are laterally sandwiched between the source/drain regions of the corresponding pairs. The gate dielectric layer 518 respectively underlie the gate electrodes 516 to separate the gate electrodes 516 from the semiconductor substrate 502. The semiconductor devices 512 may, for example, be metal-oxide-semiconductor (MOS) FETs, fin FETs, nanostructure FETs, gate-all-around (GAA) FETs, or some other suitable type of semiconductor device. Further, the semiconductor devices 512 may, for example, implement read and write circuitry for the 3D memory array 202.

A trench isolation structure 520 extends into the semiconductor substrate 502 to provide electrical isolation between the semiconductor devices 512 and other semiconductor devices (not shown) on the semiconductor substrate 502. The trench isolation structure 520 may, for example, be or comprise silicon oxide and/or some other suitable dielectric(s). Further, the trench isolation structure 520 may, for example, be or comprise a shallow trench isolation (STI) structure and/or some other suitable type of trench isolation structure.

Figure 6:
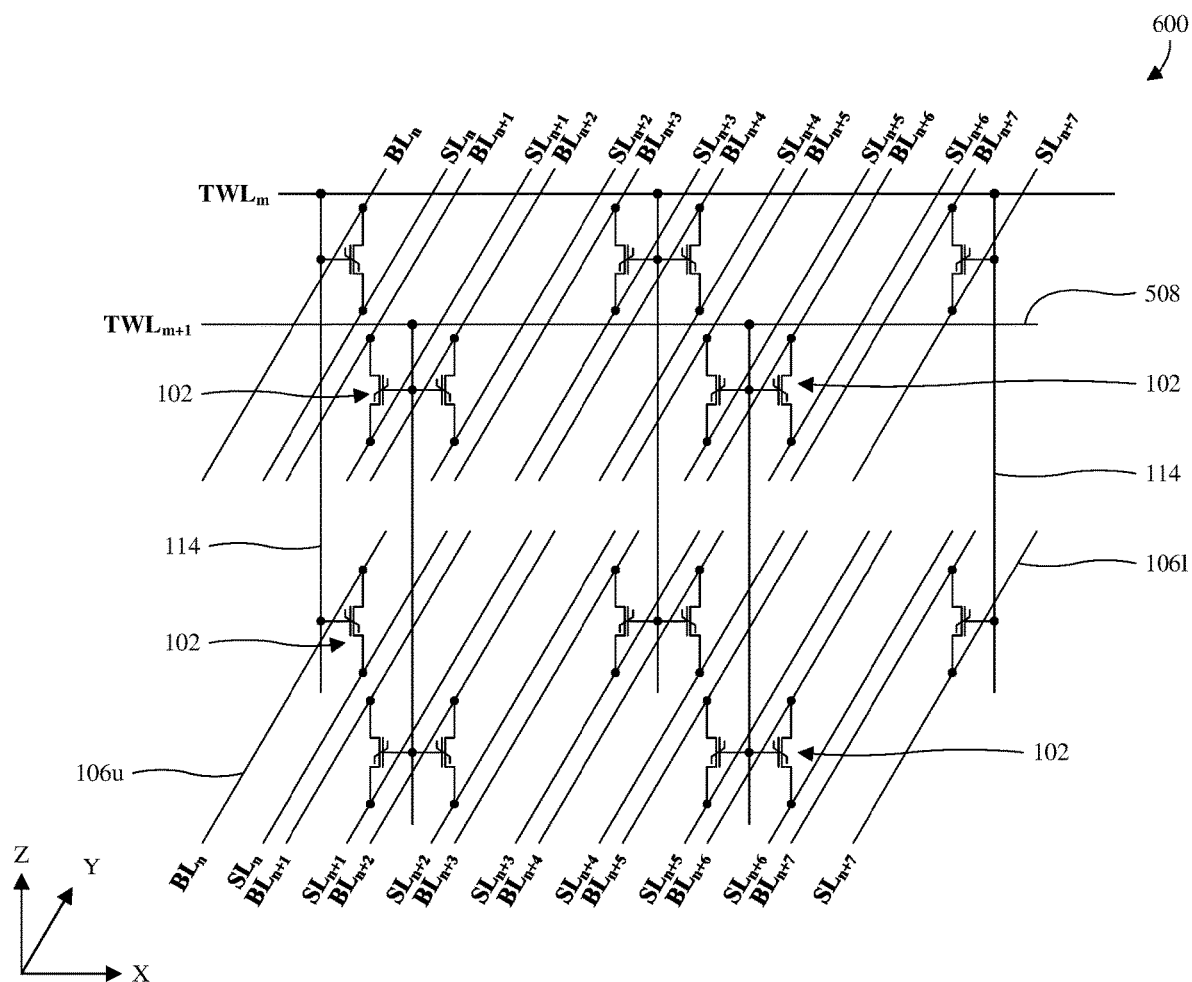
FIG. 6 illustrates a schematic view of some embodiments of a portion of the 3D memory array of FIGS. 5A-5C.

With reference to FIG. 6, a schematic view 600 of some embodiments of a portion of the 3D memory array 202 of FIGS. 5A-5C is provided within box BX of FIGS. 5A-5C. The box BX spans two rows and eight columns. The rows have corresponding top word lines TWL with subscripts denoting specific row numbers beginning at row m, where m is an integer value. The columns have corresponding bit lines BL and corresponding source lines SL with subscripts denoting specific column numbers beginning at column n, where n is an integer value.

The top word lines TWL extend correspondingly along the rows and electrically couple to the MFIS memory cells 102 in the corresponding rows via the control gate electrodes 114 in the corresponding rows. The bit lines BL and the source lines SL extend correspondingly along the columns and electrically couple to the MFIS memory cells 102 in the corresponding columns via the lower and upper source/drain regions 106*l*, 106*u* (see, e.g., FIGS. 5A-5C) in the corresponding columns. Collectively, the top word lines TWL, the bit lines BL, and the source lines SL facilitate read and write operations on the MFIS memory cells 102.

Figure 7B:
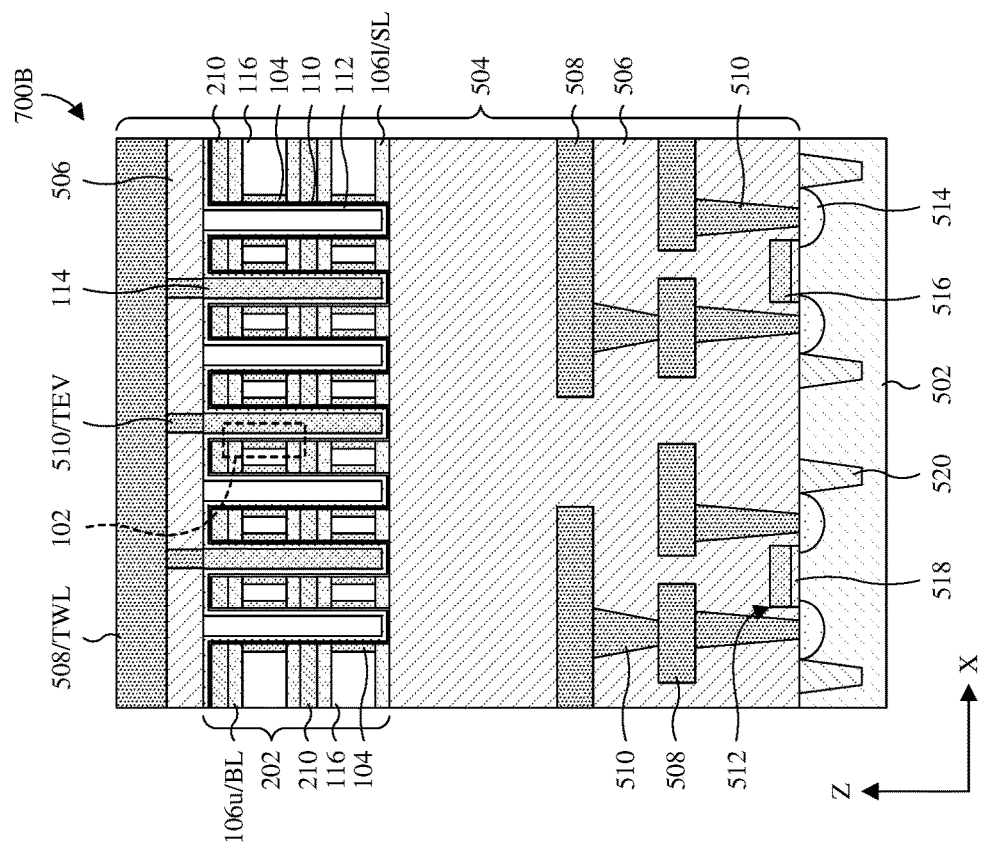
FIGS. 7A and 7B illustrate cross-sectional views of some alternative embodiments of the IC of FIGS. 5A-5C in which word lines are respectively at a bottom of the 3D memory array and a top of the 3D memory array.
Figure 7A:
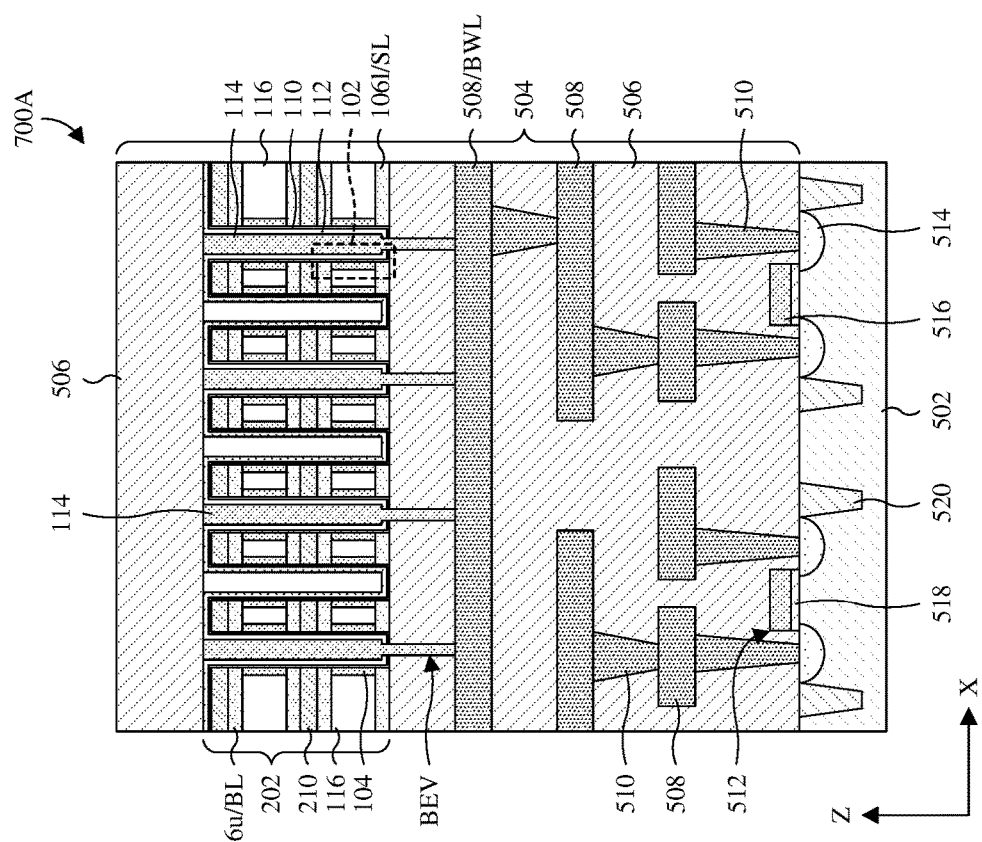

With reference to FIGS. 7A and 7B, cross-sectional views 700A, 700B of some alternative embodiments of the IC of FIGS. 5A-5C is provided in which word lines electrically couple to the control gate electrodes 114 respectively at a bottom of the 3D memory array 202 and a top of the 3D memory array 202. The cross-sectional view 700A of FIG. 7A corresponds to the cross-sectional view 500A of FIG. 5A, and the cross-sectional view 700B of FIG. 7B corresponds to the cross-sectional view 500B of FIG. 5B.

Control gate electrodes at even numbered rows electrically couple to bottom word lines BWL at a bottom of the 3D memory array 202, and control gate electrodes at odd numbered rows electrically couple to top word lines TWL at a top of the 3D memory array 202, or vice versa. Further, the control gate electrodes 114 have different cross-sectional profiles depending upon whether electrically coupled to top or bottom word lines. Control gate electrodes electrically coupled to the bottom word lines BWL have protrusions that protrude respectively to the bottom word lines BWL and that define bottom electrode vias BEV. Control gate electrodes electrically coupled the top word lines TWL lack upward and downward protrusions and are electrically coupled to the top word lines TWL by separate top electrode vias TEV.

By splitting the word lines between the bottom of the 3D memory array 202 and the top of the 3D memory array 202, a pitch of the word lines in a Y direction (e.g., into and out of the page; see, for example, FIG. 5C) may be reduced. Design constraints regarding the spacing of the word lines may otherwise limit the pitch. By reducing the pitch of the word lines, scaling down of the 3D memory array 202 may be enhanced.

Figure 8B:
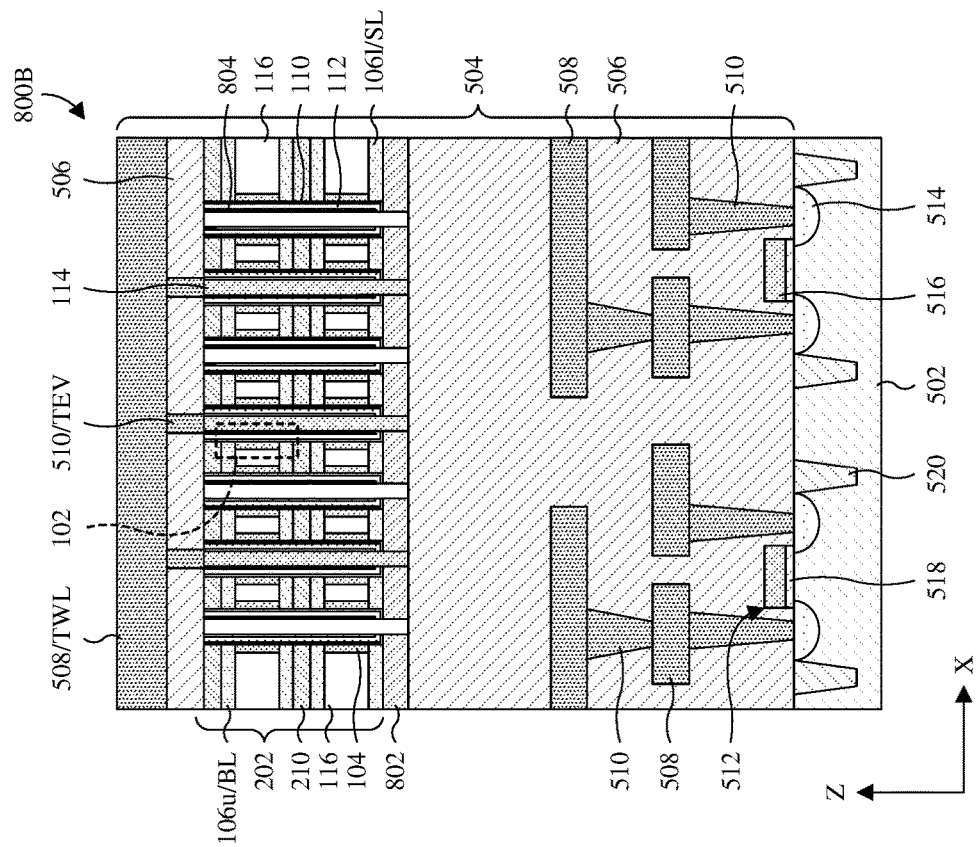
FIGS. 8A and 8B illustrate cross-sectional views of some alternative embodiments of the IC of FIGS. 7A and 7B.
Figure 8A:
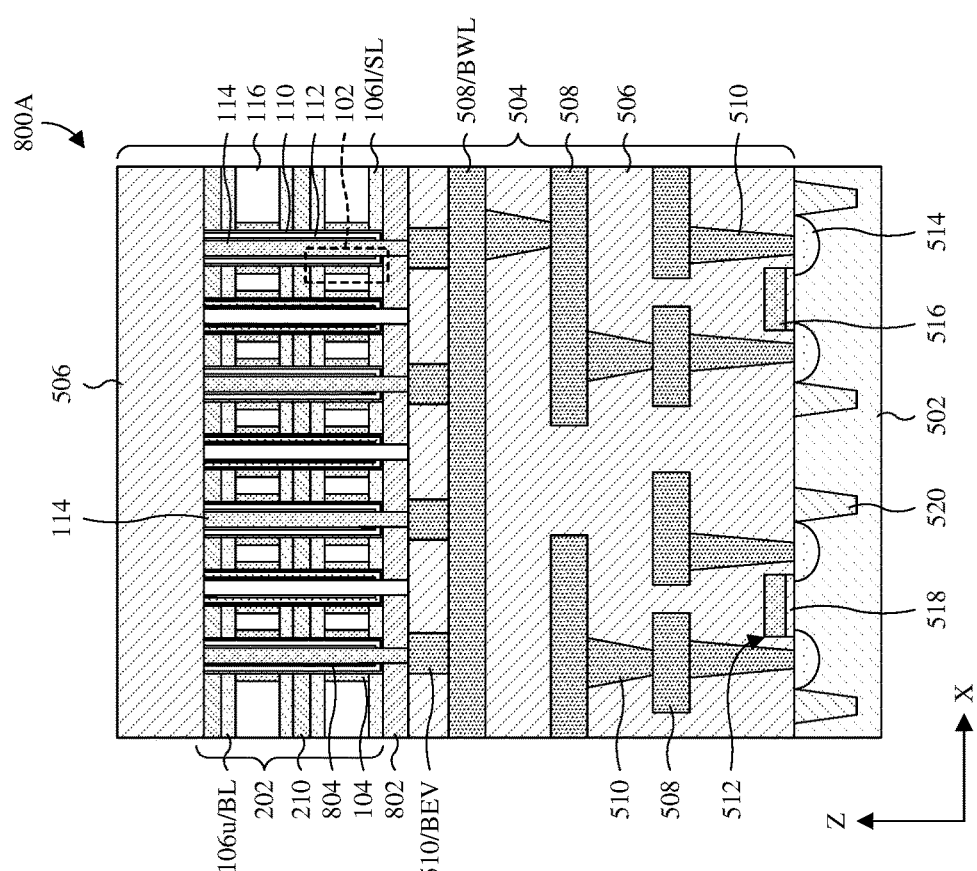

With reference to FIGS. 8A and 8B, cross-sectional views 800A, 800B of some alternative embodiments of the IC of FIGS. 7A and 7B is provided in which the bottom electrode vias BEV are independent of the control gate electrodes 114. The control gate electrodes 114 have the same or substantially the same profile regardless of whether electrically coupled to top or bottom word lines. Further, the control gate electrodes 114 extend through a cap dielectric layer 802 between the 3D memory array 202 and the bottom electrode vias BEV. Control gate electrodes electrically coupled to the bottom word lines BWL extend through the cap dielectric layer 802 respectively to the bottom electrode vias BEV. Control gate electrodes electrically coupled to the top word lines TWL extend through the cap dielectric layer 802 to the interconnect dielectric layer 506. The cap dielectric layer 802 may be or comprise, for example, silicon nitride and/or some other suitable dielectric(s).

The 3D memory array 202 is uncovered by the gate dielectric layer 110 and the ferroelectric layer 112 as in FIG. 3A. As such, the gate dielectric layer 110 comprises a plurality of discrete gate dielectric segments, and the ferroelectric layer 112 comprises a plurality of discrete ferroelectric segments. A plurality of spacers 804 separate the control gate electrodes 114 from the ferroelectric segments. Further, the dielectric structure 116 extends through the cap dielectric layer 802, the gate dielectric segments, and the ferroelectric segments. The spacers 804 may be or comprise, for example, silicon nitride and/or some other suitable dielectric(s).

As seen hereafter, the spacers 804 may be formed by a self-aligned process and used with a top one of the array dielectric layers 210 as a mask to form openings within which the control gate electrodes 114 are formed. This may lead to a reduction in the number of photomasks used while forming the 3D memory array 202. Because photolithography is expensive, the reduction may lead to a substantial cost savings. Further, as seen hereafter, the spacers 804 protect the ferroelectric layer 112 while forming openings within which the control gate electrodes 114 are formed. This, in turn, reduces the likelihood of damage to the ferroelectric layer 112 and may hence enhance performance of the MFIS memory cells 102. Further yet, by forming the bottom electrode vias BEV independent of the control gate electrodes 114, aspect ratios (e.g., ratios of height to width) of the openings within which the control gate electrodes 114 are formed may be reduced. This, in turn, may reduce the complexity of the etch used to form the openings and may enlarge the process window (e.g., the resiliency).

While the embodiments of the ICs in FIGS. 7A, 7B, 8A, and 8B were not accompanied with top views, it is to be appreciated that the top view 500C of FIG. 5C is representative of these top views with a few modifications. Top electrode vias TEV and top word lines TWL at even numbered rows or odd numbered rows, but not both, instead correspond to bottom electrode vias BEV and bottom word lines BWL and should therefore be shown in phantom. Further, sizes of electrode vias and/or shapes of electrode vias may be different. Accordingly, the cross-sectional views 700A, 800A of FIGS. 7A and 8A may, for example, be taken along line F in FIG. 5C (as modified above), and the cross-sectional views 700B, 800B of FIGS. 7B and 8B may, for example, be taken along line G in FIG. 5C (as modified above).

With reference to FIGS. 9A and 9B through FIGS. 18A and 18B, a series of views of some embodiments of a method for forming an IC comprising a 3D memory array of MFIS memory cells is provided. Figures labeled with a suffix of B illustrate cross-sectional views along line H, I, or J (whichever is present) in like-numbered figures with a suffix of A. Figures with a suffix of A illustrate top views along line H, I, or J (whichever is present) in like-numbered figures with a suffix of B. The method may, for example, be employed to form the IC of FIGS. 5A-5C or other suitable ICs.

Figure 9A:
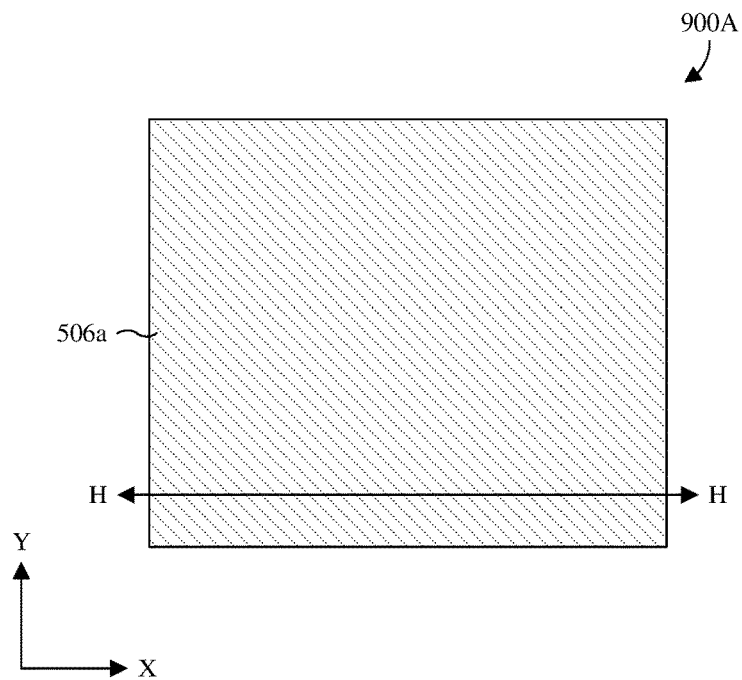
Figure 9B:
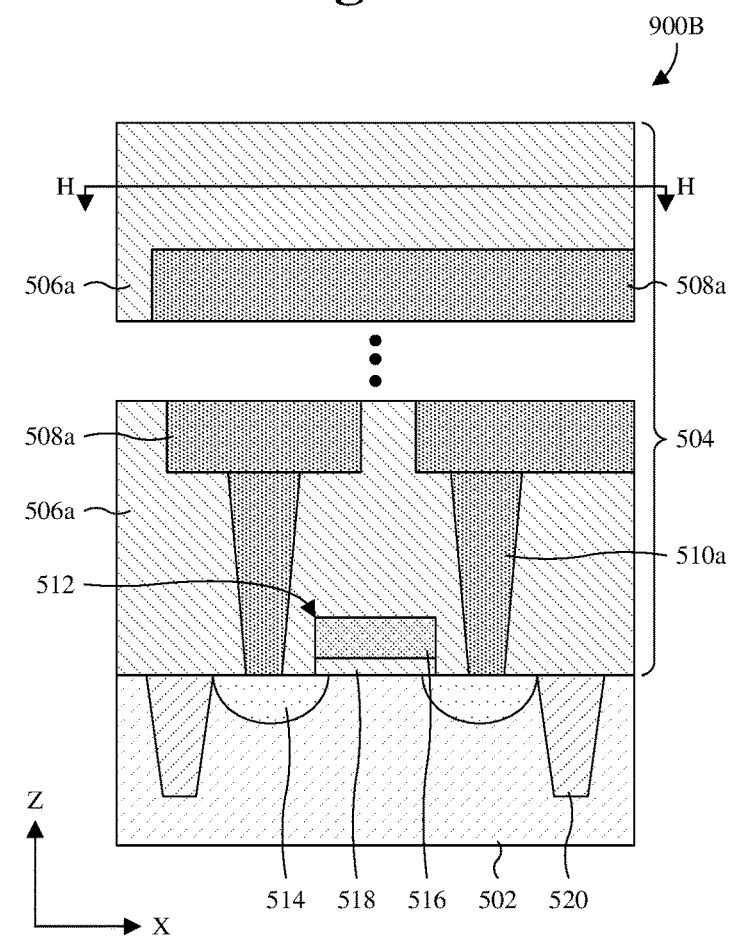

As illustrated by the top and cross-sectional views 900A, 900B of FIGS. 9A and 9B, a semiconductor device 512 and a trench isolation structure 520 are formed on a semiconductor substrate 502. The semiconductor device 512 comprises a pair of source/drain regions 514, a gate electrode 516, and a gate dielectric layer 518. The gate electrode 516 and the gate dielectric layer 518 are stacked between the source/drain regions 514. The trench isolation structure 520 surrounds the semiconductor device 512 to electrically isolate the semiconductor device 512 from other semiconductor devices (not shown).

Also illustrated by the top and cross-sectional views 900A, 900B of FIGS. 9A and 9B, an interconnect structure 504 is partially formed over the semiconductor device 512 and the semiconductor substrate 502. The interconnect structure 504 comprises a lower interconnect dielectric layer 506a, a plurality of lower wires 508a, and a plurality of lower vias 510a. The lower wires 508a and the lower vias 510a are alternatingly stacked in the lower interconnect dielectric layer 506a and define conductive paths leading from the semiconductor device 512 and other semiconductor devices (not shown) on the semiconductor substrate 502.

Figure 10A:
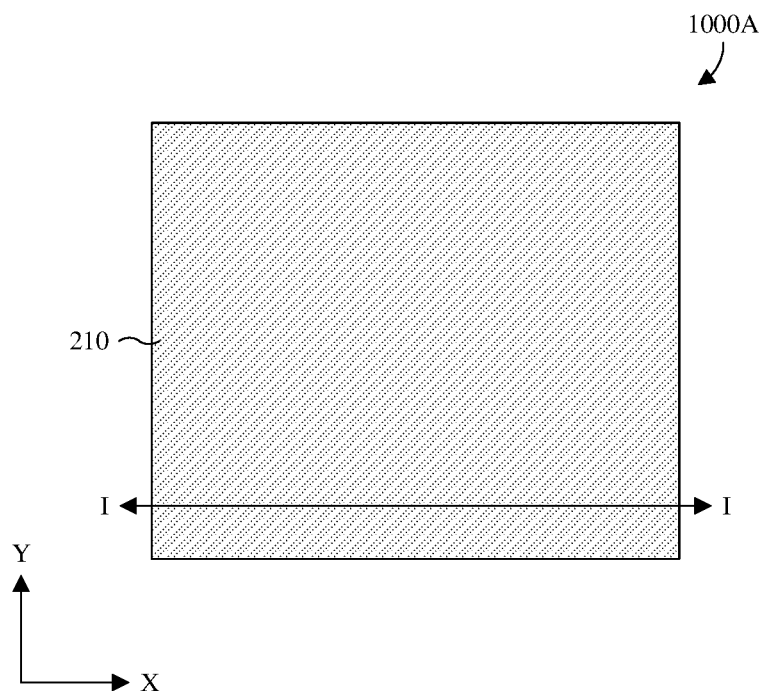
Figure 10B:
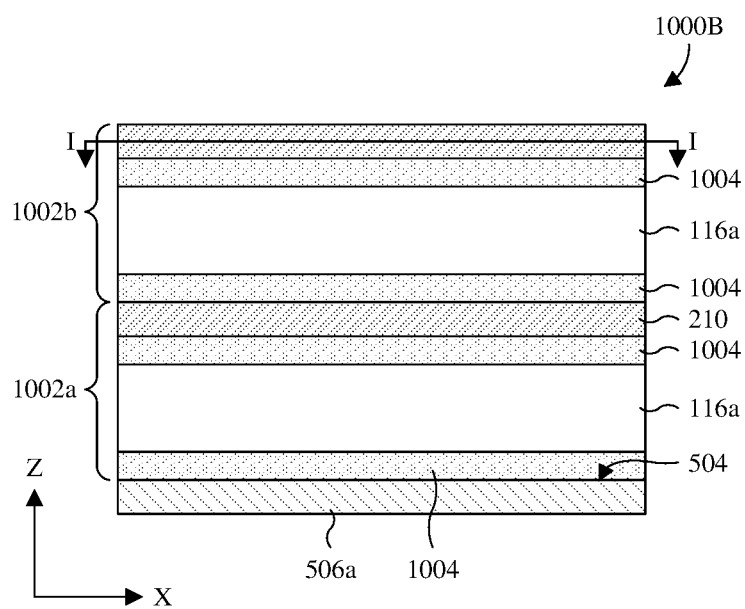

As illustrated by the top and cross-sectional views 1000A, 1000B of FIGS. 10A and 10B, a first memory film 1002a and a second memory film 1002b are deposited over the interconnect structure 504 of FIGS. 9A and 9B. For ease of illustration, only a top portion of the interconnect structure 504 corresponding to the lower interconnect dielectric layer 506a is shown. A remainder of the interconnect structure 504 is as shown in FIGS. 9A and 9B. The first and second memory films 1002a, 1002b comprise corresponding source/drain layers 1004, corresponding source/drain dielectric layers 116a, and corresponding array dielectric layers 210 that are vertically stacked. The source/drain dielectric layers 116a are each between two of the source/drain layers 1004. The array dielectric layers 210 are respectively at a top of the first and second memory films 1002a, 1002b and are a different material than portions of the lower interconnect dielectric layer 506a extending along a top surface of the lower interconnect dielectric layer 506a.

In some embodiments, the source/drain layers 1004 are or comprise doped polysilicon and/or some other suitable semiconductor material(s). In some embodiments, the source/drain dielectric layers 116a are or comprise silicon oxide and/or some other suitable dielectric(s). In some embodiments, the array dielectric layers 210 are or comprise silicon nitride and/or some other suitable dielectric(s).

While two memory films are deposited stacked over the interconnect structure 504, more or less memory films may be deposited in alternative embodiments. For example, the second memory film 1002b may be omitted, such that only a single memory film may be deposited. As another example, the second memory film 1002b may be repeatedly deposited, such that three or more memory films may be deposited. In alternative embodiments, to form a 3D memory array according to FIG. 4A, barrier layers 406 and metal layers 404 may be deposited stacked with the source/drain layers 1004, the source/drain dielectric layers 116a, and the array dielectric layers 210. In alternative embodiments, to form a 3D memory array according to FIG. 4C, silicide layers may be deposited stacked with the source/drain layers 1004, the source/drain dielectric layers 116a, and the array dielectric layers 210. In alternative embodiments, to form a 3D memory array according to FIG. 4D, silicide layers may be deposited in place of the source/drain layers 1004.

Figure 11A:
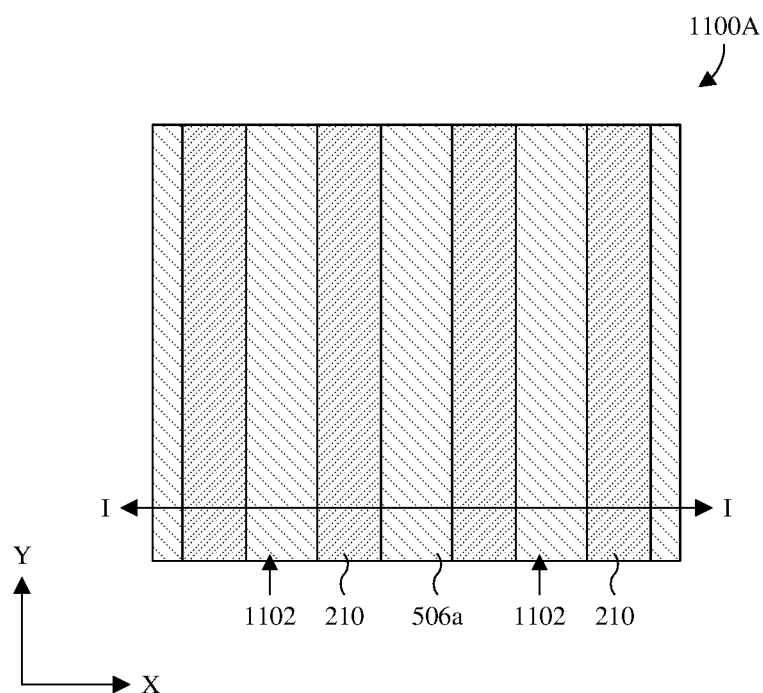
Figure 11B:
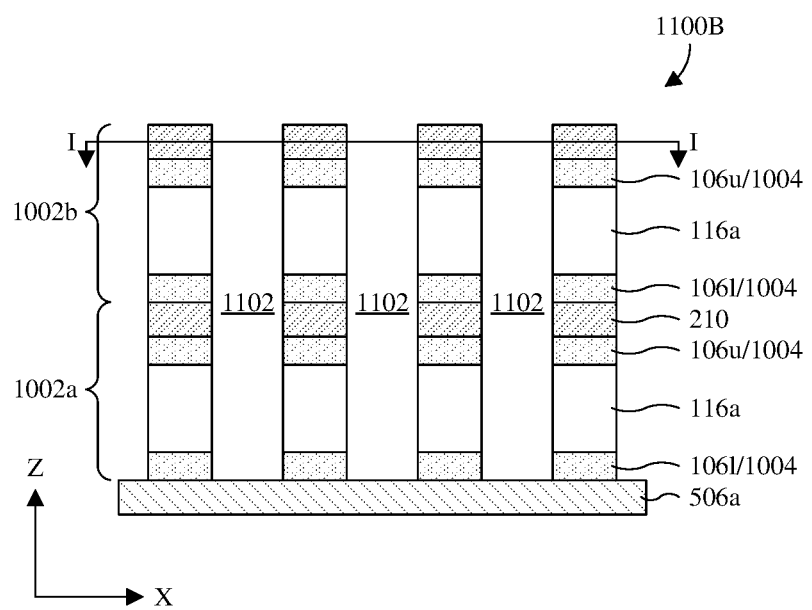

As illustrated by the top and cross-sectional views 1100A, 1100B of FIGS. 11A and 11B, the first and second memory films 1002a, 1002b are patterned to form a plurality of trenches 1102. The trenches 1102 are laterally elongated in parallel in a direction (e.g., a Y direction) transverse to the cross-sectional view 1100B of FIG. 11B. In some embodiments, the direction is the direction that columns of the 3D memory array being formed extend and/or the trenches 1102 have the same or substantially the same dimensions as each other. Further, the patterning divides the source/drain layers 1004 into lower source/drain regions 106l and upper source/drain regions 106u. The lower source/drain regions 106l are at lower sides of corresponding source/drain dielectric layers, and the upper source/drain regions 106u are at upper sides of corresponding source/drain dielectric layers. The patterning may, for example, be performed by a photolithography/etching process and/or some other suitable patterning process. The photolithography/etching process may, for example, use dry etching and/or some other suitable type of etching.

Figure 12A:
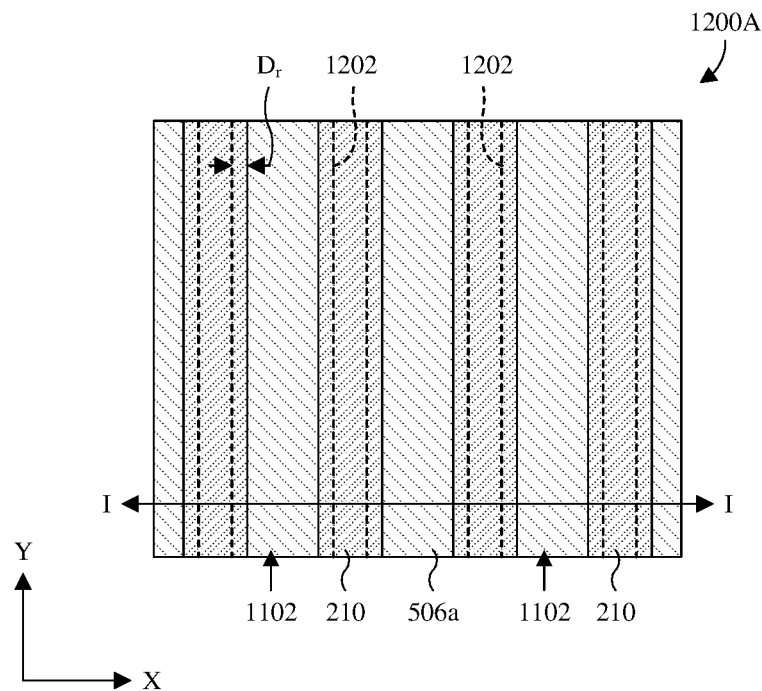
Figure 12B:
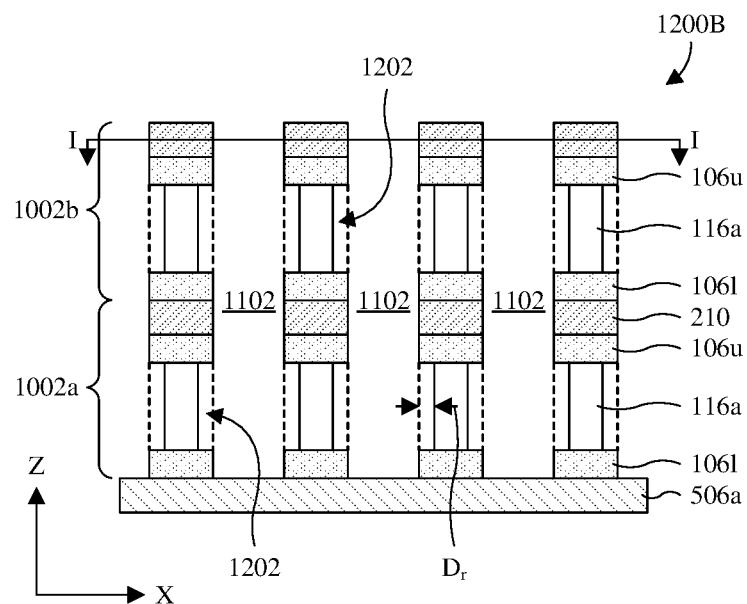

As illustrated by the top and cross-sectional views 1200A, 1200B of FIGS. 12A and 12B, the source/drain dielectric layers 116a are laterally recessed through the trenches 1102. The recessing recesses sidewalls of the source/drain dielectric layers 116a, relative to neighboring sidewalls of the lower and upper source/drain regions 106l, 106u, to form recesses 1202 with a lateral depth $D_r$. Note that the recesses 1202 are shown in phantom in FIG. 12A. In some embodiments, the lateral depth $D_r$ is about 10-30 nanometers, about 10-20 nanometers, about 20-30 nanometers, or some other suitable depth. The lateral recessing may, for example, be performed by wet etching and/or some other suitable type of etching.

Figure 13A:
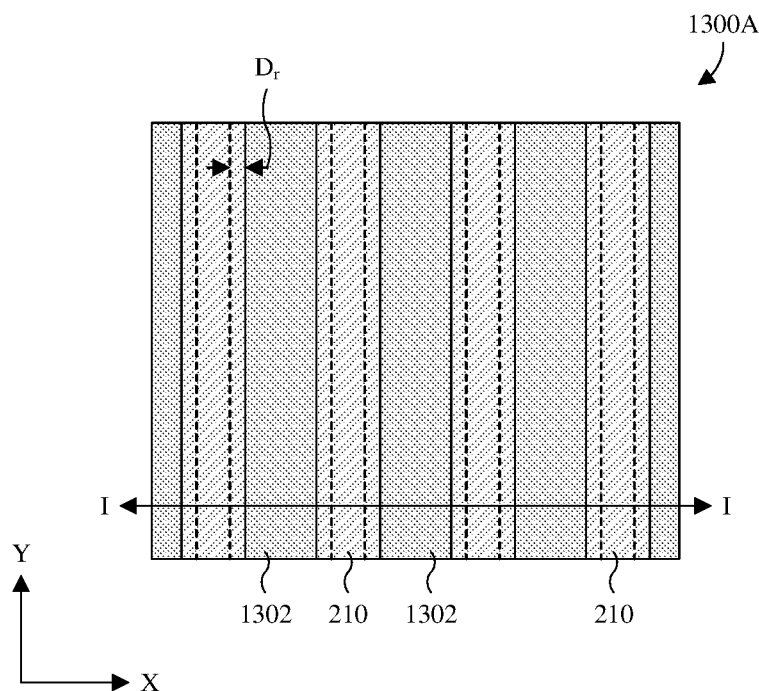
Figure 13B:
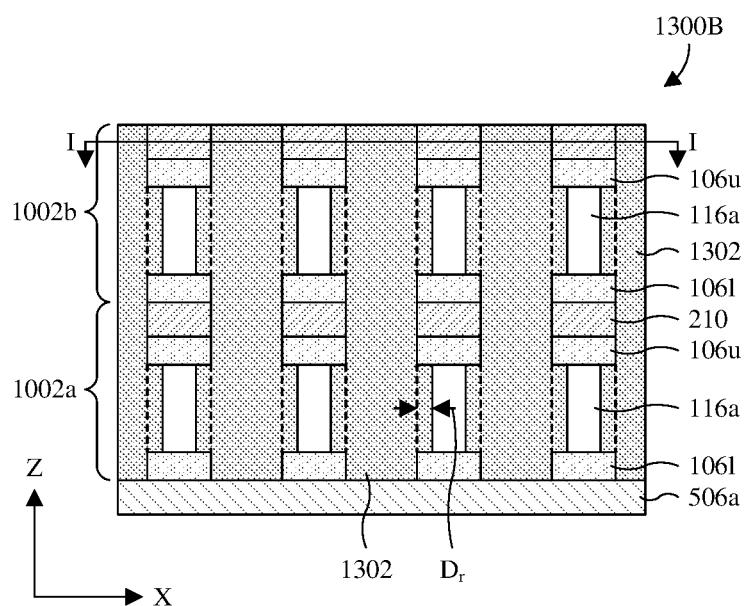

As illustrated by the top and cross-sectional views 1300A, 1300B of FIGS. 13A and 13B, a semiconductor layer 1302 is formed filling the trenches 1102 (see, e.g., FIGS. 12A and 12B) and the recesses 1202 (see, e.g., FIGS. 12A and 12B). In some embodiments, the semiconductor layer 1302 is doped. In alternative embodiments, the semiconductor layer 1302 is undoped. In some embodiments, the semiconductor layer 1302 is or comprises polysilicon and/or some other suitable semiconductor material(s).

A process for forming the semiconductor layer 1302 may, for example, comprise: 1) depositing the semiconductor layer 1302; and 2) performing a planarization into the semiconductor layer 1302 until the array dielectric layer 210 of the second memory film 1002b is reached. Alternatively, other suitable processes may form the semiconductor layer 1302. The planarization may, for example, be performed by a chemical mechanical polish (CMP) or some other suitable planarization.

While the semiconductor layer 1302 is formed fully filling the trenches 1102 and the recesses 1202, the semiconductor layer 1302 may be formed lining and partially filling the trenches 1102 and the recesses 1202 in alternative embodiments. Such alternative embodiments may, for example, arise while forming a 3D memory array according to FIGS. 3C-3E. In some embodiments in which the semiconductor layer 1302 is formed lining and partially filling the trenches 1102 and the recesses 1202, a gate dielectric layer is formed lining and partially filling the trenches and the recesses 1202 over the semiconductor layer 1302. Such alternative embodiments may, for example, arise while forming a 3D memory array according to FIGS. 3D and 3E.

Figure 14A:
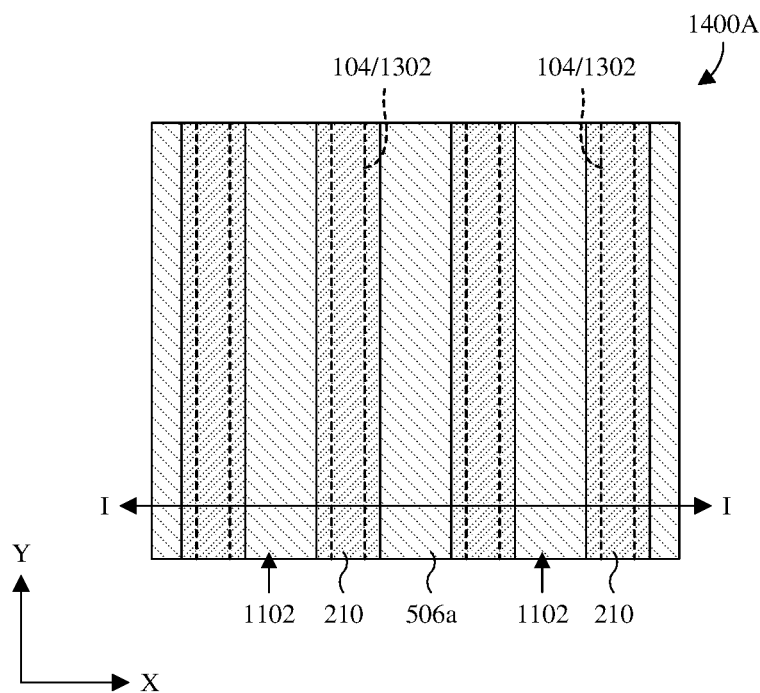
Figure 14B:
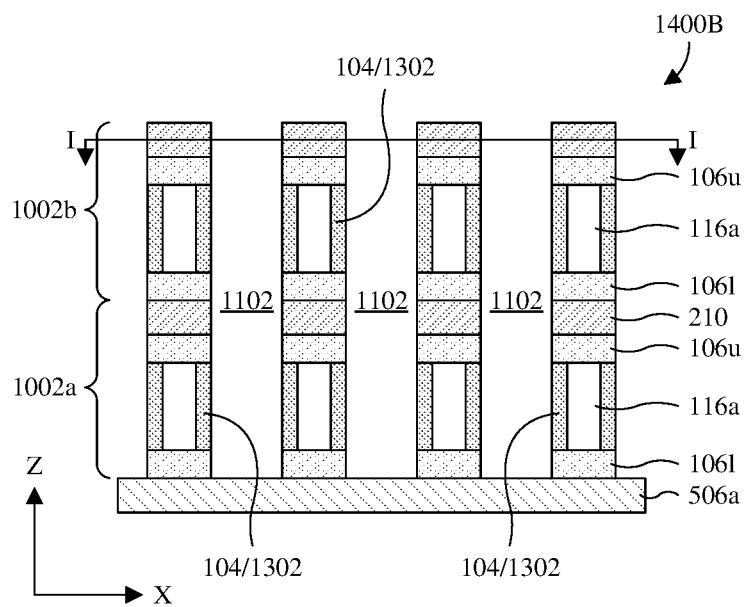

As illustrated by the top and cross-sectional views 1400A, 1400B of FIGS. 14A and 14B, the trenches 1102 are cleared. However, the recesses 1202 (see, e.g., FIGS. 12A and 12B) are not cleared or are minimally cleared. By doing so, a plurality of semiconductor channels 104 are formed localized to the recesses 1202 from the semiconductor layer 1302. The clearing may, for example, be performed by dry etching and/or some other suitable type of etching. Alternatively, other suitable processes for clearing the trenches 1102 may, for example, be performed. In some embodiments, the array dielectric layer 210 of the second memory film 1002b is used as a mask during the etching.

Figure 15A:
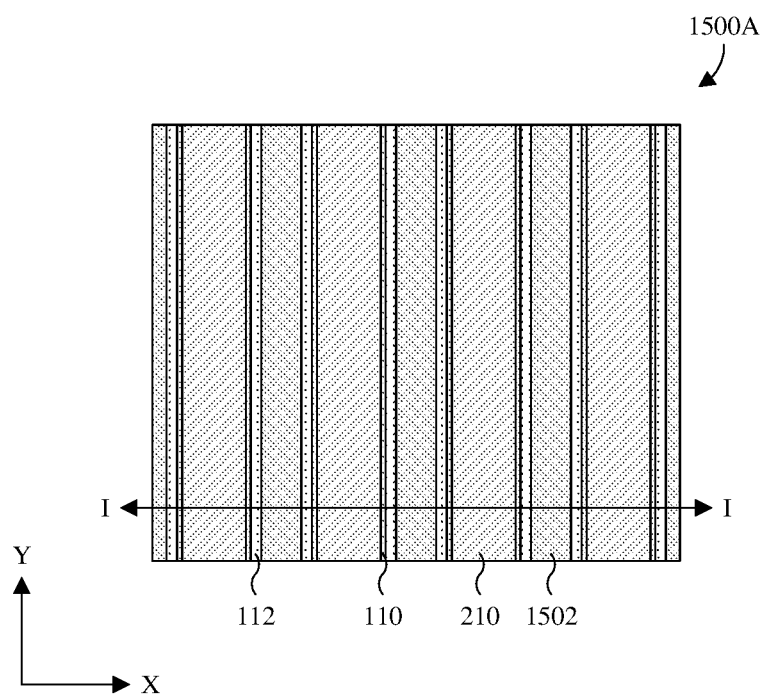
Figure 15B:
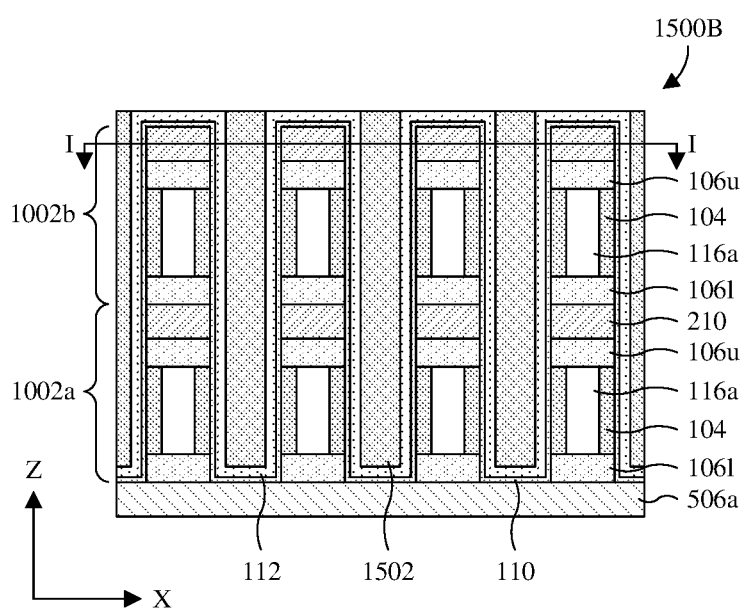

As illustrated by the top and cross-sectional views 1500A, 1500B of FIGS. 15A and 15B, a gate dielectric layer 110, a ferroelectric layer 112, and a control electrode layer 1502 (collectively the trench layers) are formed filling the trenches 1102. The gate dielectric layer 110 is formed lining and partially filling the trenches 1102, and the ferroelectric layer 112 is formed lining and partially filling the trenches 1102 over the gate dielectric layer 110. The control electrode layer 1502 is formed filling a remainder of the trenches 1102 over the ferroelectric layer 112. In some embodiments, the control electrode layer 1502 is or comprises titanium nitride, doped polysilicon, tantalum nitride, tungsten, some other suitable conductive material(s), or any combination of the foregoing. In some embodiments, the ferroelectric layer 112 is or comprises doped hafnium oxide (e.g., doped with aluminum, silicon, zirconium, lanthanum, strontium, or the like) and/or some other suitable ferroelectric material(s). In some embodiments, the gate dielectric layer 110 is or comprises silicon oxide, aluminum oxide, silicon oxynitride, silicon nitride, lanthanum oxide, strontium titanium oxide, undoped hafnium oxide, or some other suitable dielectric material(s), or any combination of the foregoing. In some embodiments, the gate dielectric layer 110 is or comprises a high k dielectric layer.

A process for forming the trench layers may, for example, comprise: 1) depositing the gate dielectric layer 110; 2) depositing the ferroelectric layer 112 over the gate dielectric layer 110; 3) depositing the control electrode layer 1502 over the ferroelectric layer 112; and 4) performing a planarization into the control electrode layer 1502 until the ferroelectric layer 112 is reached. Alternatively, other suitable processes may form the trench layers. For example, the planarization may alternatively be performed until the second memory film 1002b is reached. The planarization may, for example, be performed by a CMP or some other suitable planarization.

Figure 16A:
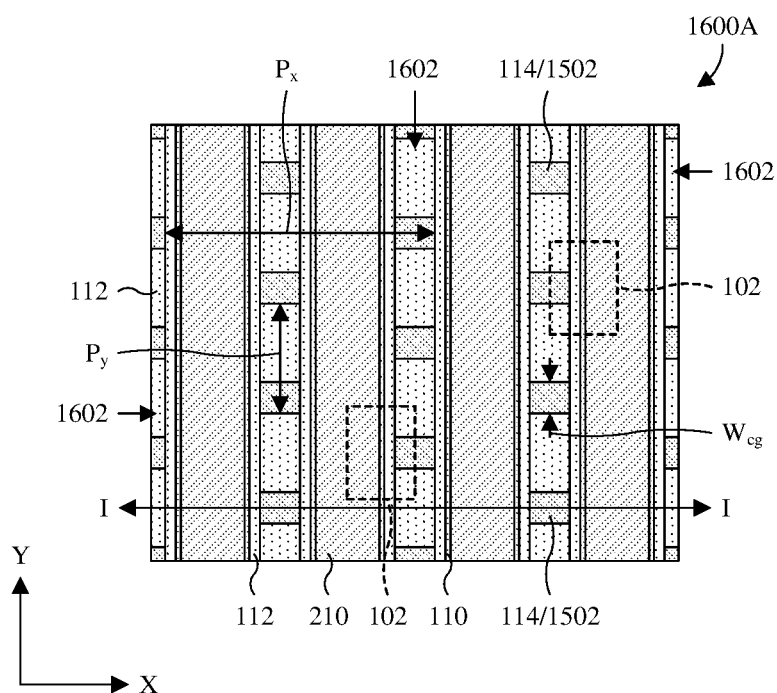
Figure 16B:
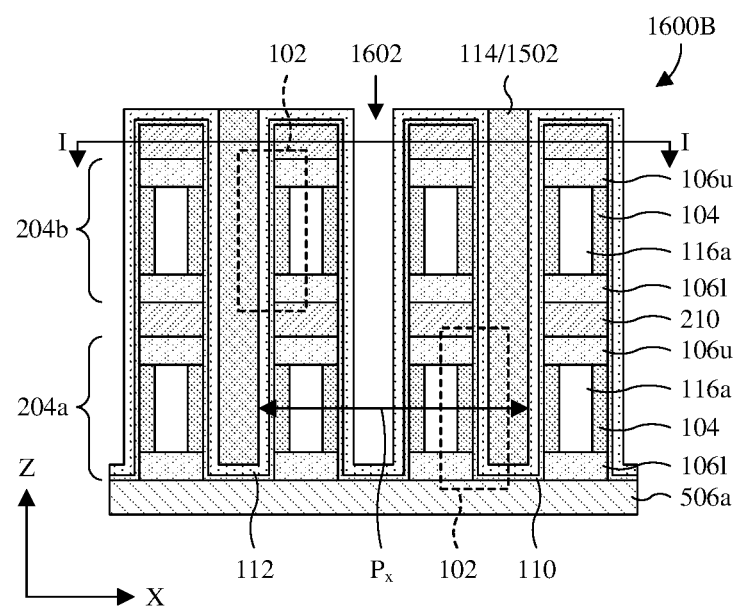

As illustrated by the top and cross-sectional views 1600A, 1600B of FIGS. 16A and 16B, the control electrode layer 1502 is patterned to form a plurality of gate isolation openings 1602 dividing the control electrode layer 1502 into a plurality of control gate electrodes 114. The control gate electrodes 114 are arranged in a plurality of rows and a plurality of columns, such that a control gate electrode occurs every other column along each row and such that a control gate electrode occurs every other row along each column. Further, the control gate electrodes 114 are staggered along neighboring columns and neighboring rows, such that a pitch $P_y$ of the control gate electrodes 114 in the Y direction spans a row and a pitch $P_x$ of the control gate electrodes 114 in the X direction spans two columns. In some embodiments, the control gate electrodes 114 have individual widths $W_{cg}$ that are less than about half the Y-direction pitch $P_y$.

The patterning may, for example, be performed by a photolithography/etching process and/or some other suitable patterning process. The photolithography/etching process may, for example, use the ferroelectric layer 112 as an etch stop and/or may, for example, use dry etching and/or some other suitable type of etching.

Dividing the control electrode layer 1502 into the control gate electrodes 114 completes a first memory array 204a and a second memory array 204b. The first and second memory arrays 204a, 204b are vertically stacked and are made up of a plurality of MFIS memory cells 102. In some embodiments, the MFIS memory cells 102 are as described at FIGS. 1A-1C and/or FIGS. 2A-2D. Each of the MFIS memory cells 102 has a localized portion of the ferroelectric layer 112, which has a polarity representing a bit of data.

During program and erase operations for any one of the MFIS memory cells 102, the lower and upper source/drain regions 106l, 106u of the MFIS memory cell are electrically coupled in parallel and used as a proxy for the semiconductor channel 104 of the MFIS memory cell. A program voltage is applied from the control gate electrode 114 of the MFIS memory cell to the semiconductor channel 104 (e.g., via the lower and upper source/drain regions 106l, 106u) to set the polarity to a programmed state. Further, an erase voltage having an opposite polarity as the program voltage is applied from the control gate electrode 114 to the semiconductor channel 104 (e.g., via the lower and upper source/drain regions 106l, 106u) to set the polarity to an erased state. The programmed state may, for example, represent a binary "1", whereas the erased state may, for example, represent a binary "0", or vice versa.

The ferroelectric layer 112 screens an electric field produced by the control gate electrode 114 differently depending whether the polarity is in the programmed state or the erased state. As such, the MFIS memory cell has a programmed threshold voltage and an erased threshold voltage respectively while the polarity is in the programmed and erased states. During a read operation of the MFIS memory cell, the control gate electrode 114 is biased with a read voltage between the programmed and erased threshold voltages and the resistance of the semiconductor channel 104 is measured. Depending upon whether the semiconductor channel 104 conducts, the polarity is either in the programmed or erased state.

By using the ferroelectric layer 112 for data storage, as opposed to a silicon nitride layer, there is no dependence on carrier tunneling for the program and erase operations. As such, program and erase voltages may be reduced and program and erase speeds may be increased. For example, the program and erase voltages may be reduced to less than about 5 volts and/or program and erase speeds may be reduced to less than about 100 nanoseconds. Other suitable values are, however, amenable. By reducing the program and erase voltages and by increasing the program and erase speeds, power consumption may be reduced.

Figure 17A:
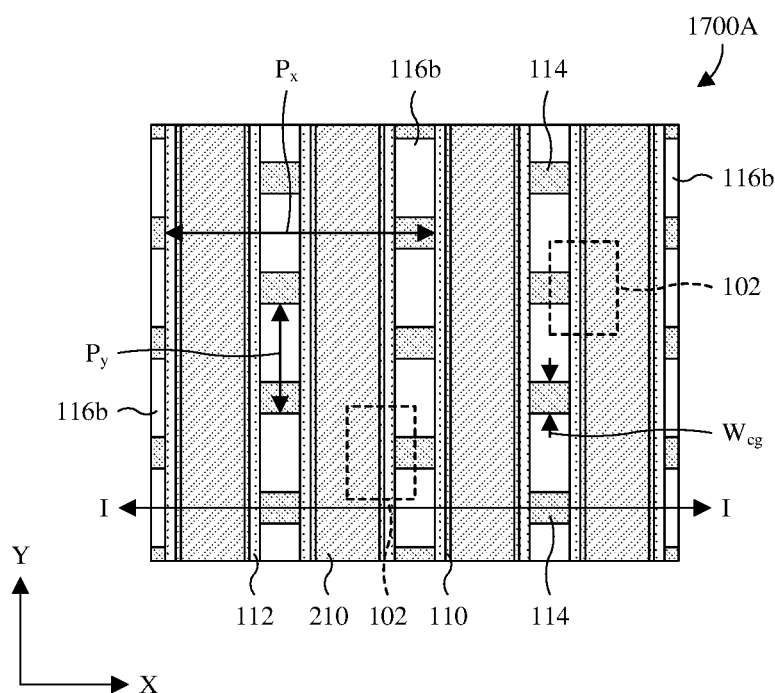
Figure 17B:
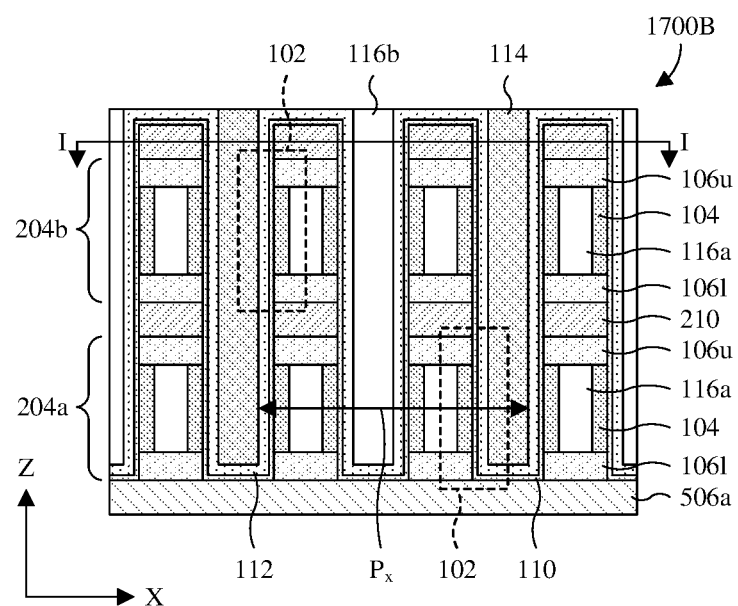

As illustrated by the top and cross-sectional views 1700A, 1700B of FIGS. 17A and 17B, an inter-gate dielectric layer 116b is formed filling the gate isolation openings 1602 (see, e.g., FIGS. 16A and 16B). The inter-gate dielectric layer 116b may, for example, be or comprise silicon oxide and/or some other suitable dielectric(s). A process for forming the inter-gate dielectric layer 116b may, for example, comprise: 1) depositing an inter-gate dielectric layer 116b filling the gate isolation openings 1602; and 2) performing a planarization into the inter-gate dielectric layer 116b until the ferroelectric layer 112 is exposed. In alternative embodiments, the inter-gate dielectric layer 116b is formed by some other suitable process. Further, in alternative embodiments, the planarization stops before the ferroelectric layer 112 is exposed and top electrode vias hereafter formed are formed in a top portion of the inter-gate dielectric layer 116b.

Figure 18A:
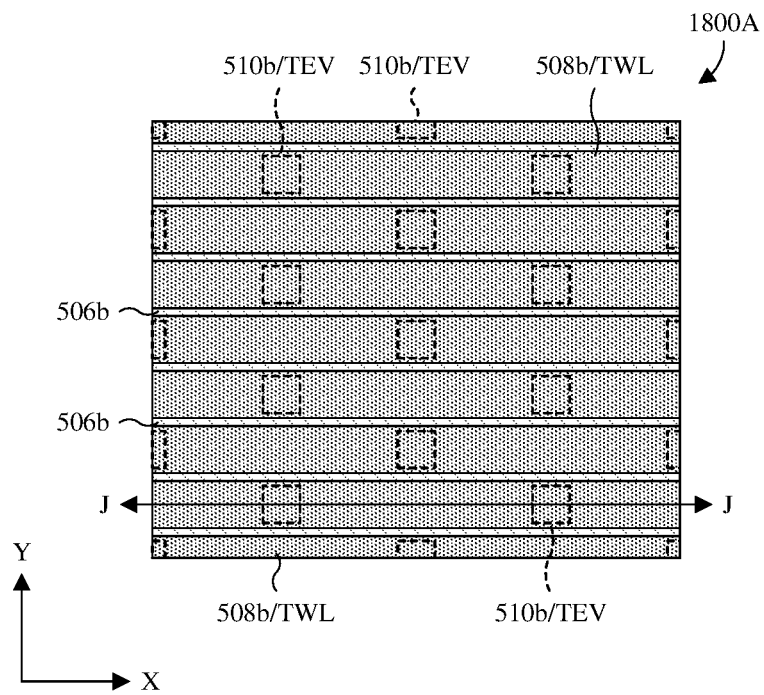
Figure 18B:
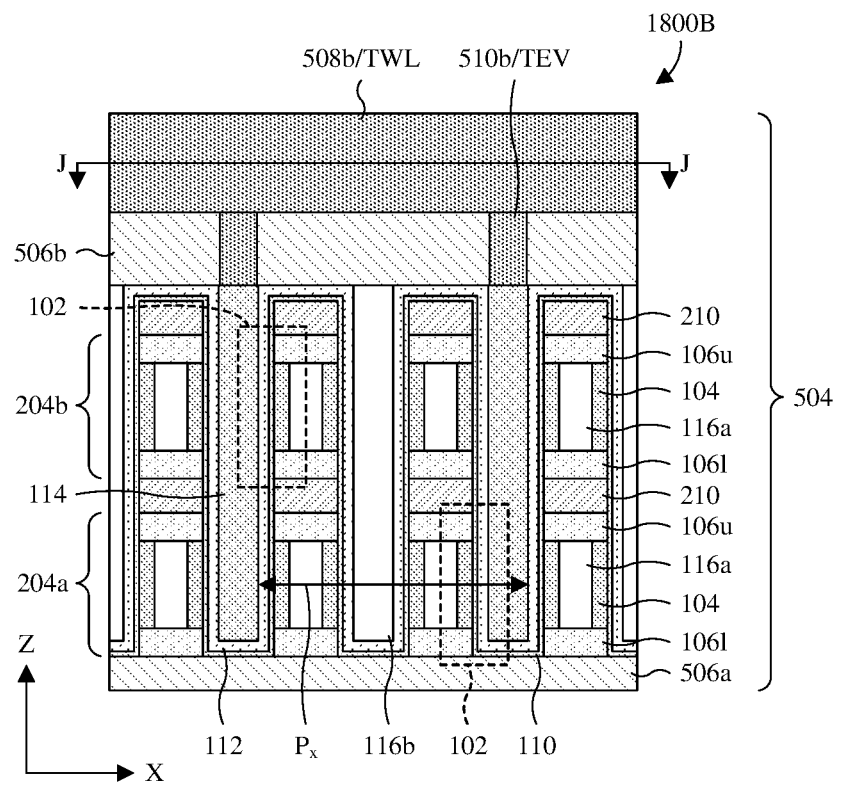

As illustrated by the top and cross-sectional views 1800A, 1800B of FIGS. 18A and 18B, the interconnect structure 504 is completed. An upper interconnect dielectric layer 506b is formed over the first and second memory arrays 204a, 204b, and a plurality of upper wires 508b and a plurality of upper vias 510b are formed stacked in the upper interconnect dielectric layer 506b. At least some of the upper wires 508b define top word lines TWL, and at least some of the upper vias 510b define top electrode vias TEV. The top word lines TWL extend correspondingly along rows of the control gate electrodes 114, and the top electrode vias TEV extend respectively from the top word lines TWL respectively to the control gate electrodes 114.

While FIGS. 9A and 9B through FIGS. 18A and 18B are described with reference to various embodiments of a method, it will be appreciated that the structures shown in FIGS. 9A and 9B through FIGS. 18A and 18B are not limited to the method but rather may stand alone separate of the method. While FIGS. 9A and 9B through FIGS. 18A and 18B are described as a series of acts, it will be appreciated that the order of the acts may be altered in other embodiments. While FIGS. 9A and 9B through FIGS. 18A and 18B illustrate and describe as a specific set of acts, some acts that are illustrated and/or described may be omitted in other embodiments. Further, acts that are not illustrated and/or described may be included in other embodiments.

Figure 19:
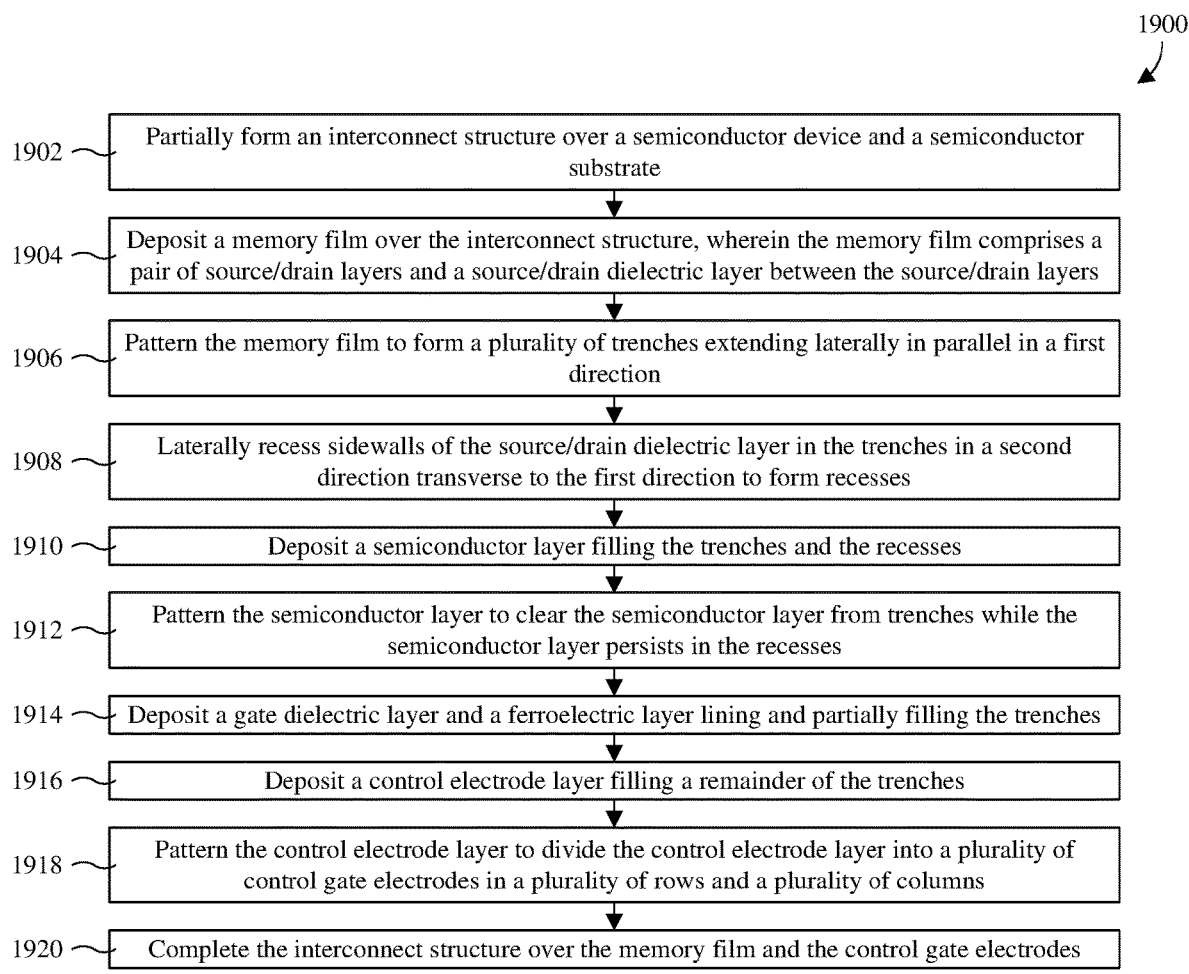
FIG. 19 illustrates a block diagram of some embodiments of the method of FIGS. 9A and 9B through FIGS. 18A and 18B.

With reference to FIG. 19, a block diagram 1900 of some embodiments of the method of FIGS. 9A and 9B through FIGS. 18A and 18B is provided.

At 1902, an interconnect structure is partially formed over a semiconductor device and a semiconductor substrate. See, for example, FIGS. 9A and 9B.

At 1904, a memory film is deposited over the interconnect structure, wherein the memory film comprises a pair of source/drain layers and a source/drain dielectric layer between the source/drain layers. See, for example, FIGS. 10A and 10B.

At 1906, the memory film is patterned to form a plurality of trenches extending laterally in parallel in a first direction. See, for example, FIGS. 11A and 11B.

At 1908, sidewalls of the source/drain dielectric layer are laterally recessed in the trenches in a second direction transverse to the first direction to form recesses. See, for example, FIGS. 12A and 12B.

At 1910, a semiconductor layer is deposited filling the trenches and the recesses. See, for example, FIGS. 13A and 13B.

At 1912, the semiconductor layer is patterned to clear the semiconductor layer from the trenches while the semiconductor layer persists in the recesses. See, for example, FIGS. 14A and 14B.

At 1914, a gate dielectric layer and a ferroelectric layer are deposited lining and partially filling the trenches. See, for example, FIGS. 15A and 15B.

At 1916, a control electrode layer is deposited filling a remainder of the trenches. See, for example, FIGS. 15A and 15B.

At 1918, the control electrode layer is patterned to divide the control electrode layer into a plurality of control gate electrodes in a plurality of rows and a plurality of columns. See, for example, FIGS. 16A and 16B.

At 1920, the interconnect structure is completed over the memory film and the control gate electrodes. See, for example, FIGS. 17A and 17B and FIGS. 18A and 18B.

While the block diagram 1900 of FIG. 19 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 20A and 20B through FIGS. 27A and 27B, a series of views of some embodiments of a method for forming an IC comprising a 3D memory array of MFIS memory cells is provided in which word lines are respectively at a bottom and a top of the 3D memory array. Figures labeled with a suffix of B illustrate cross-sectional views along line K, L, or M (whichever is present) in like-numbered figures with a suffix of A. Figures with a suffix of A illustrate top views along line K, L, or M (whichever is present) in like-numbered figures with a suffix of B. The method may, for example, be employed to form the IC of FIGS. 8A and 8B or other suitable ICs.

Figure 20A:
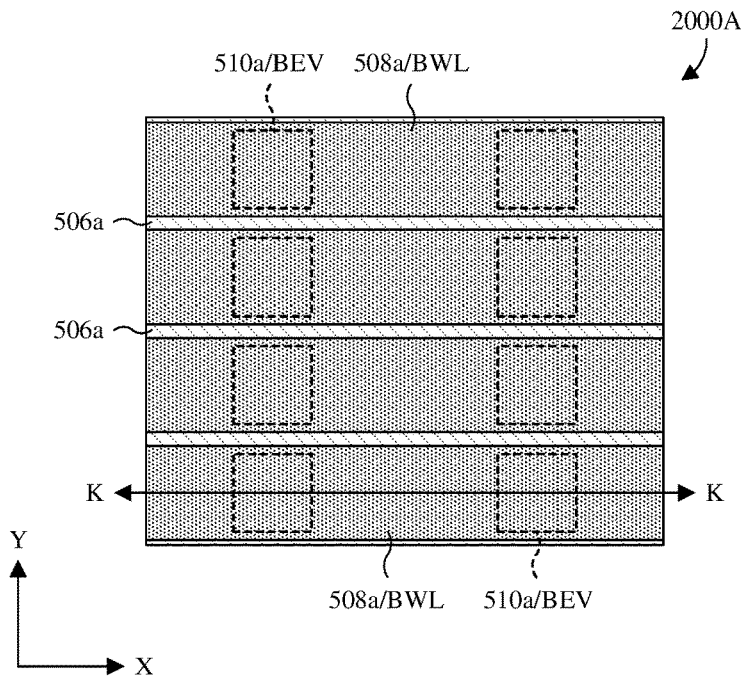
Figure 20B:
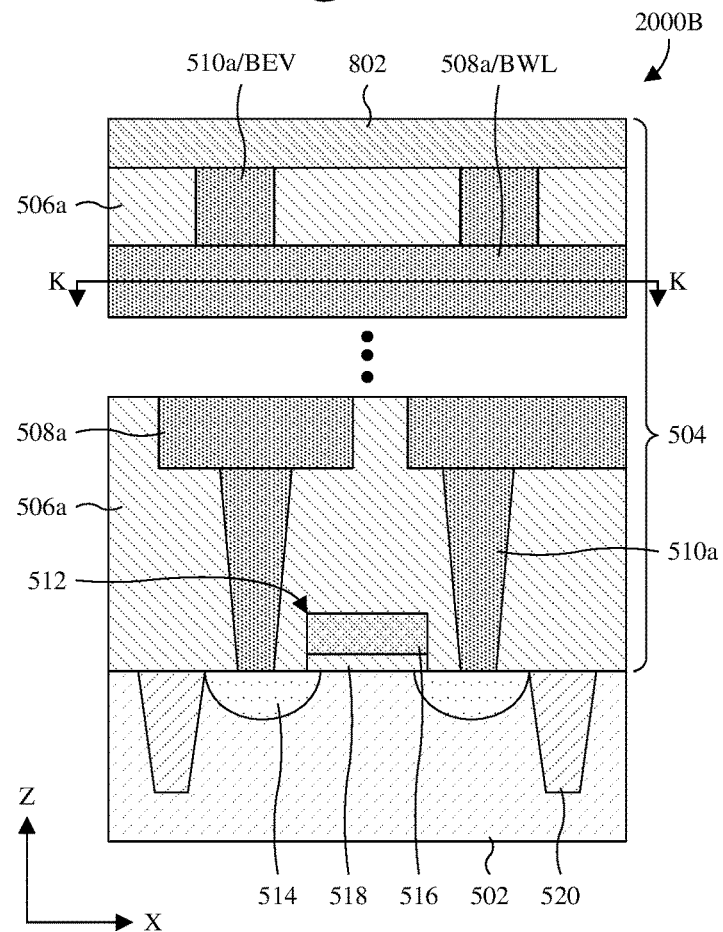

As illustrated by the top and cross-sectional views 2000A, 2000B of FIGS. 20A and 20B, a semiconductor device 512 and a trench isolation structure 520 are formed on a semiconductor substrate 502 as illustrated and described at FIGS. 9A and 9B.

Also illustrated by the top and cross-sectional views 2000A, 2000B of FIGS. 20A and 20B, an interconnect structure 504 is partially formed over the semiconductor device 512 and the semiconductor substrate 502. The interconnect structure 504 comprises a lower interconnect dielectric layer 506a, a cap dielectric layer 802, a plurality of lower wires 508a, and a plurality of lower vias 510a. The lower wires 508a and the lower vias 510a are alternatingly stacked in the lower interconnect dielectric layer 506a and define conductive paths leading from the semiconductor device 512 and other semiconductor devices (not shown) on the semiconductor substrate 502. Further, the lower wires 508a define bottom word lines BWL at a top of the interconnect structure 504, and the lower vias 510a define bottom electrode vias BEV respectively overlying the bottom word lines BWL. The cap dielectric layer 802 covers the lower interconnect dielectric layer 506a and the bottom electrode vias BEV.

Figure 21A:
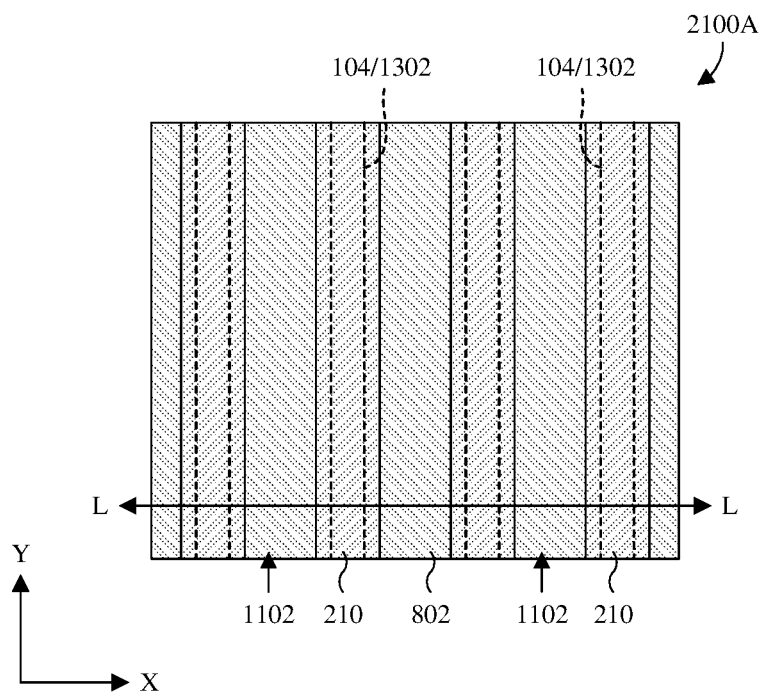
Figure 21B:
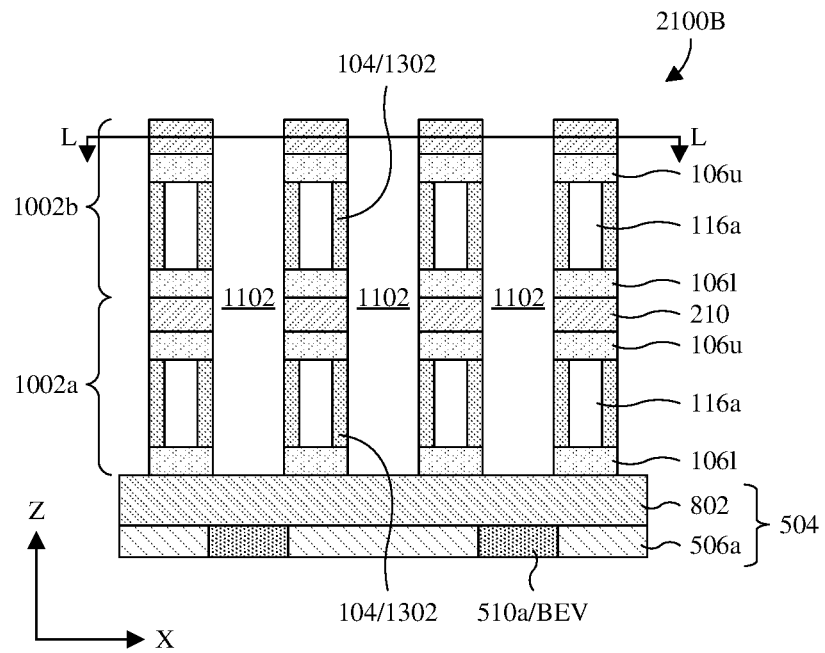

As illustrated by the top and cross-sectional views 2100A, 2100B of FIGS. 21A and 21B, the acts at FIGS. 10A and 10B through FIGS. 14A and 14B are performed on the interconnect structure 504 of FIGS. 20A and 20B. For ease of illustration, only a top portion of the interconnect structure 504 is shown. A remainder of the interconnect structure 504 is as shown in FIGS. 20A and 20B.

According to the acts at FIGS. 10A and 10B through FIGS. 14A and 14B, a first memory film 1002a and a second memory film 1002b are deposited as illustrated and described at FIGS. 10A and 10B. The first and second memory films 1002a, 1002b are patterned to form a plurality of trenches 1102 as illustrated and described at FIGS. 11A and 11B. The source/drain dielectric layers 116a are laterally recessed through the trenches 1102 to form recesses 1202 (see, e.g., FIGS. 12A and 12B) as illustrated and described at FIGS. 12A and 12B. A semiconductor layer 1302 is formed filling the trenches 1102 and the recesses 1202 as illustrated and described at FIGS. 13A and 13B. The trenches 1102 are cleared as illustrated and described at FIGS. 14A and 14B.

Figure 22A:
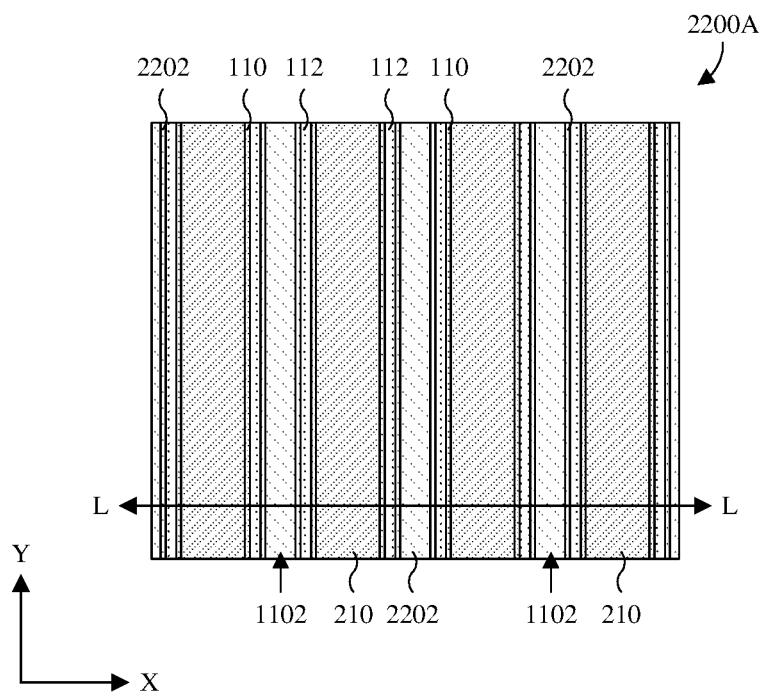
Figure 22B:
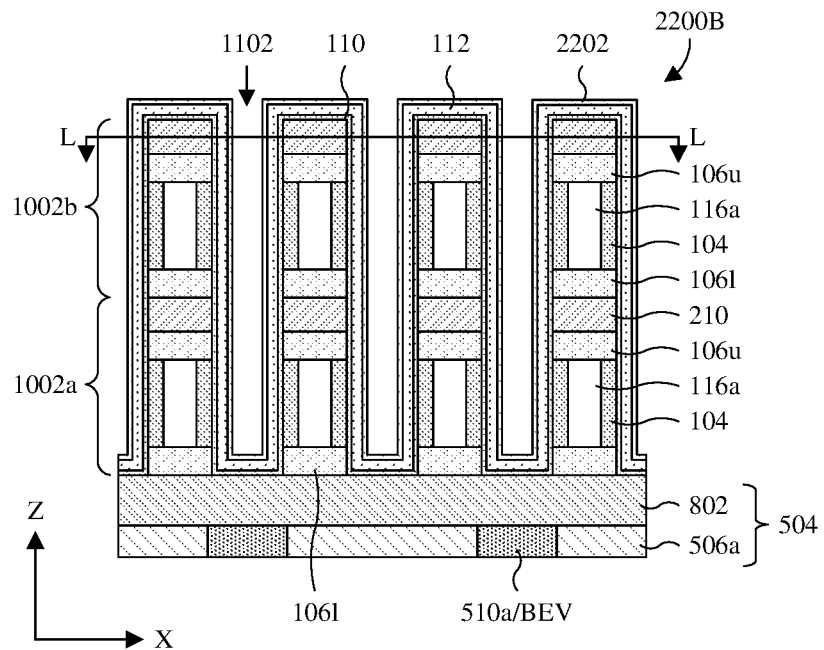

As illustrated by the top and cross-sectional views 2200A, 2200B of FIGS. 22A and 22B, a gate dielectric layer 110, a ferroelectric layer 112, and a spacer layer 2202 are formed lining and partially filling the trenches 1102. The ferroelectric layer 112 is formed lining and partially filling the trenches 1102 over the gate dielectric layer 110, and the spacer layer 2202 is formed lining and partially filling the trenches 1102 over the ferroelectric layer 112. The spacer layer 2202 may, for example, be or comprise silicon nitride and/or some other suitable dielectric(s).

Figure 23A:
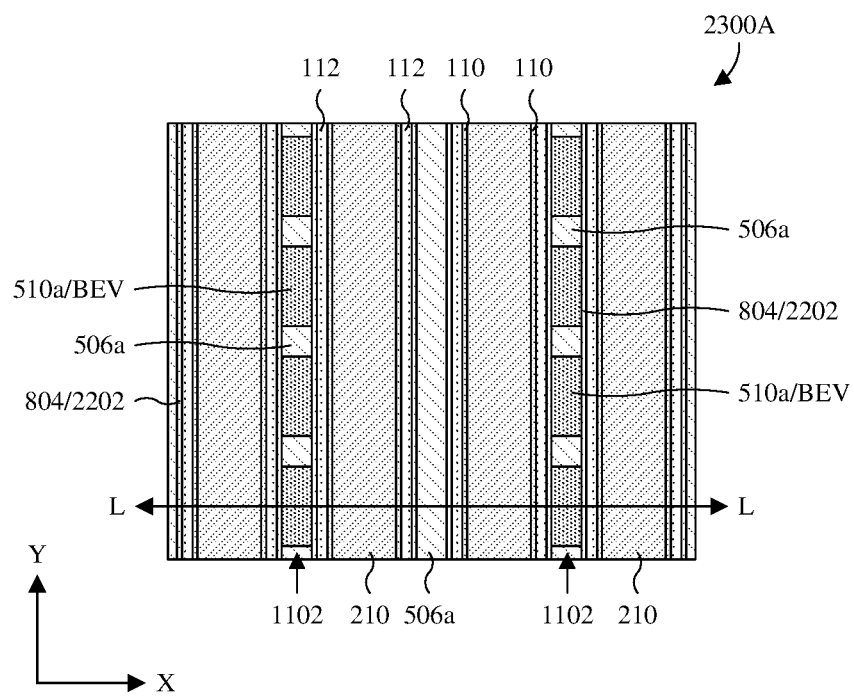
Figure 23B:
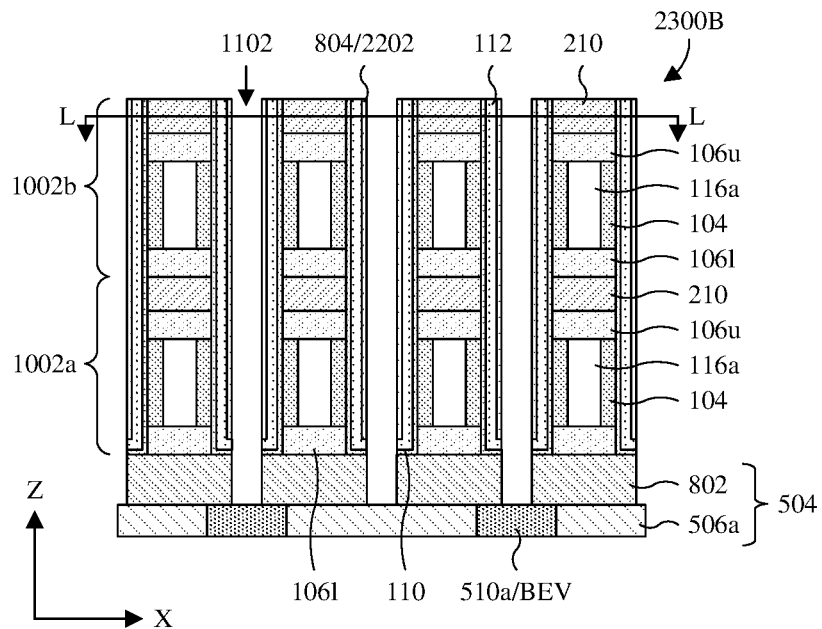

As illustrated by the top and cross-sectional views 2300A, 2300B of FIGS. 23A and 23B, an etching process is performed into the spacer layer 2202, the ferroelectric layer 112, the gate dielectric layer 110, and the cap dielectric layer 802 to extend the trenches 1102 to the bottom electrode vias BEV. Initially, the spacer layer 2202 is etched back and spacers 804 are formed from the spacer layer 2202 along sidewalls of the trenches 1102. Thereafter, the spacers 804 and the array dielectric layer 210 of the second memory film 1002b serve as a mask while etching through the ferroelectric layer 112, the gate dielectric layer 110, and the cap dielectric layer 802. These two steps of the etching process may, for example, be performed by the same etch or by different etches.

In alternative embodiments, instead of forming the spacer layer 2202 at FIGS. 22A and 22B and subsequently performing the etching process at FIGS. 23A and 23B, a photolithography/etching process may be performed to form openings at bottoms of the trenches 1102 that extend respectively to the bottom electrode vias BEV. The method may then proceed as described hereafter. These alternative embodiments may, for example, be employed to form the IC of FIGS. 7A and 7B or other suitable ICs.

Figure 24A:
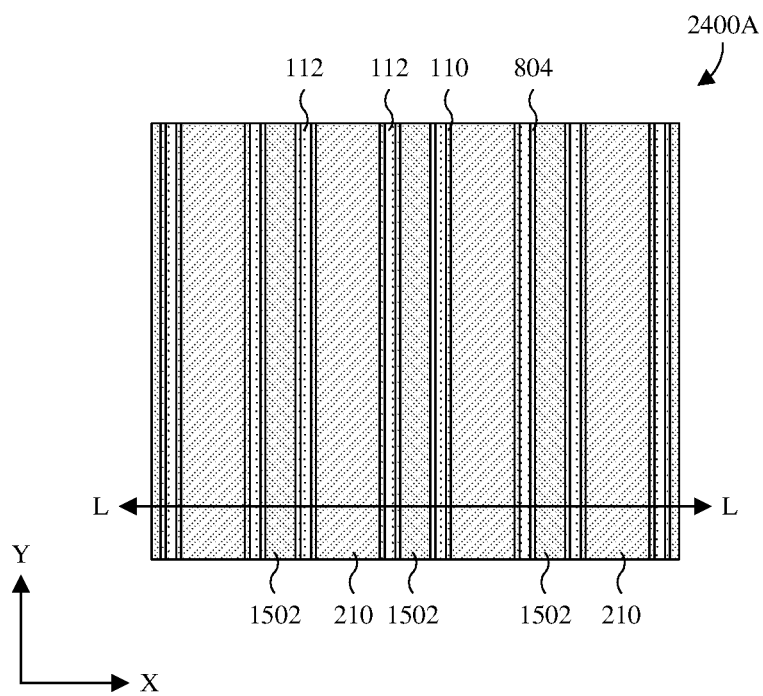
Figure 24B:
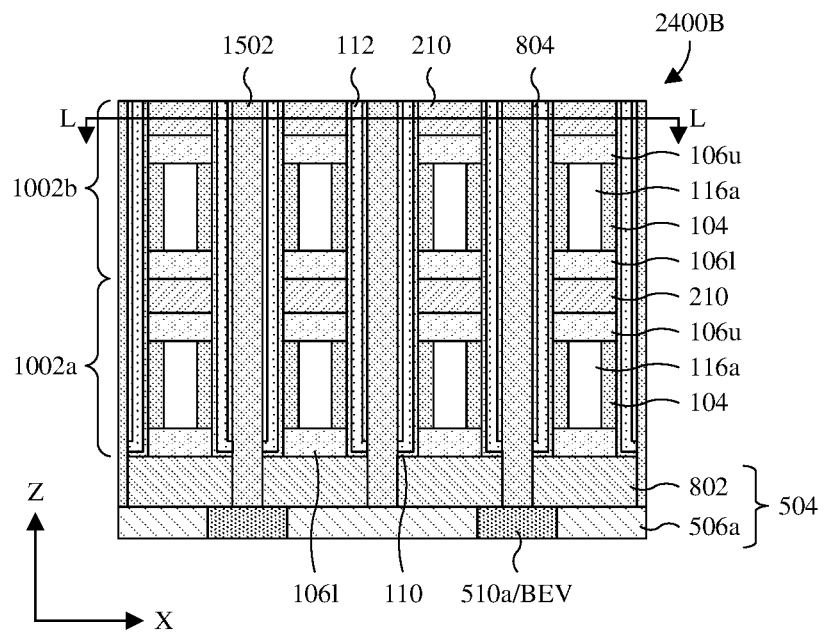
Figure 25A:
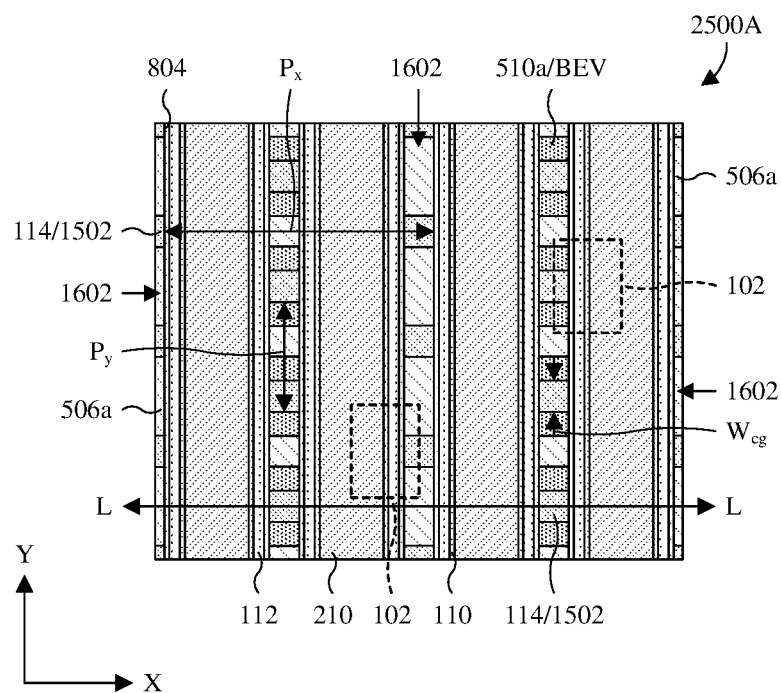
Figure 25B:
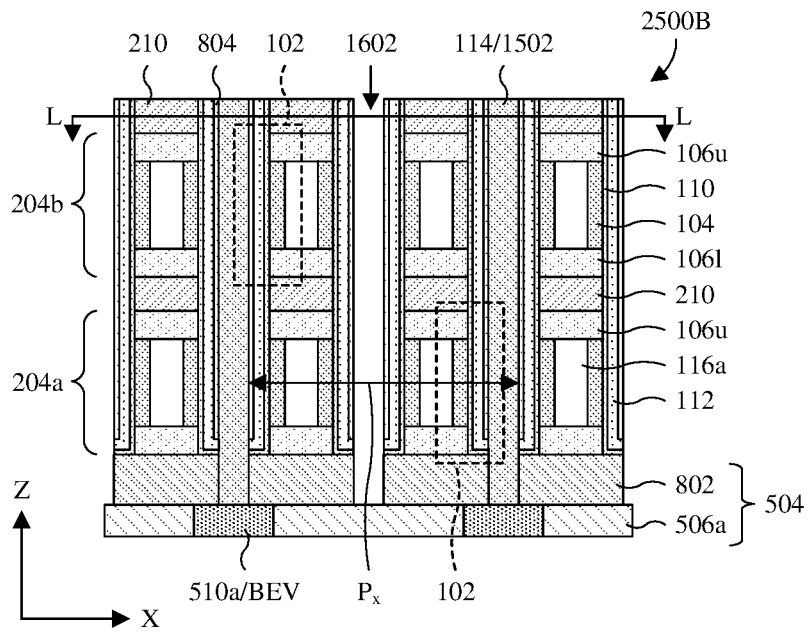
Figure 26A:
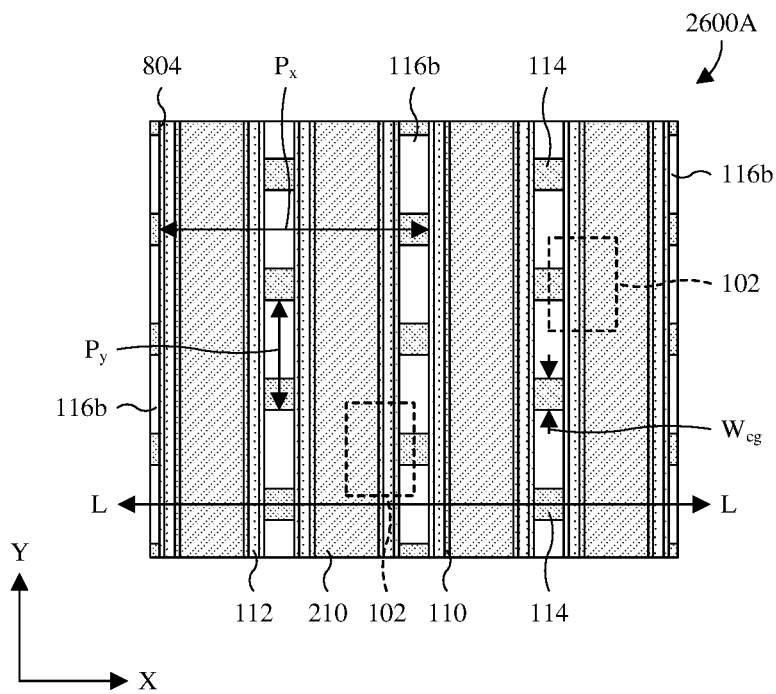
Figure 26B:
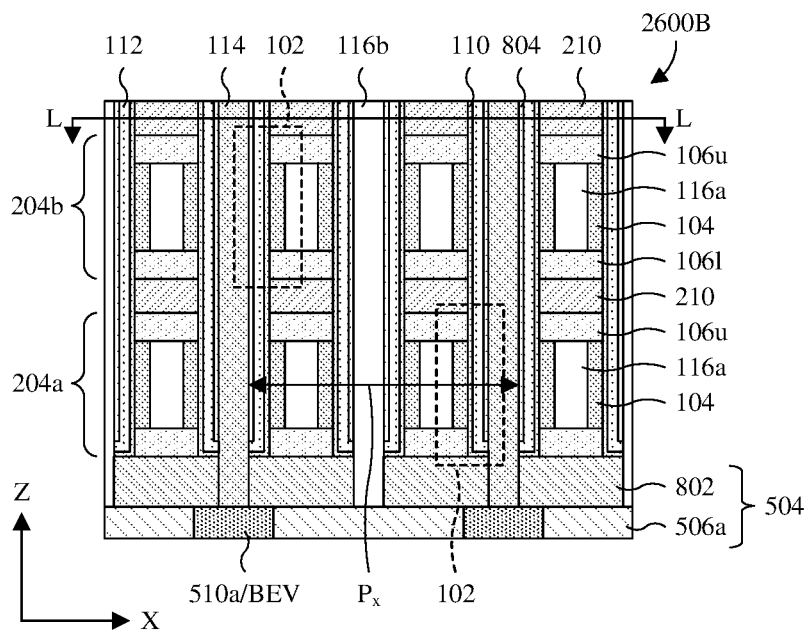

As illustrated by the top and cross-sectional views 2400A, 2400B of FIGS. 24A and 24B, a control electrode layer 1502 is formed filling the trenches 1102. A process for forming the control electrode layer 1502 may, for example, comprise: 1) depositing the control electrode layer 1502; and 2) performing a planarization into the control electrode layer 1502 until the array dielectric layer 210 of the second memory film 1002b is reached. Alternatively, other suitable processes may form the control electrode layer 1502. The planarization may, for example, be performed by a CMP or some other suitable planarization.

As illustrated by the views of FIGS. 25A and 25B and FIGS. 26A and 26B, the acts at FIGS. 16A and 16B and FIGS. 17A and 17B are performed. At the top and cross-sectional views 2500A, 2500B of FIGS. 25A and 25B, the control electrode layer 1502 is patterned to form a plurality of gate isolation openings 1602 dividing the control electrode layer 1502 into a plurality of control gate electrodes 114 as illustrated and described at FIGS. 16A and 16B. At the top and cross-sectional views 2600A, 2600B of FIGS. 26A and 26B, an inter-gate dielectric layer 116b is formed filling the gate isolation openings 1602 (see, e.g., FIGS. 25A and 25B) as illustrated and described at FIGS. 17A and 17B.

Figure 27A:
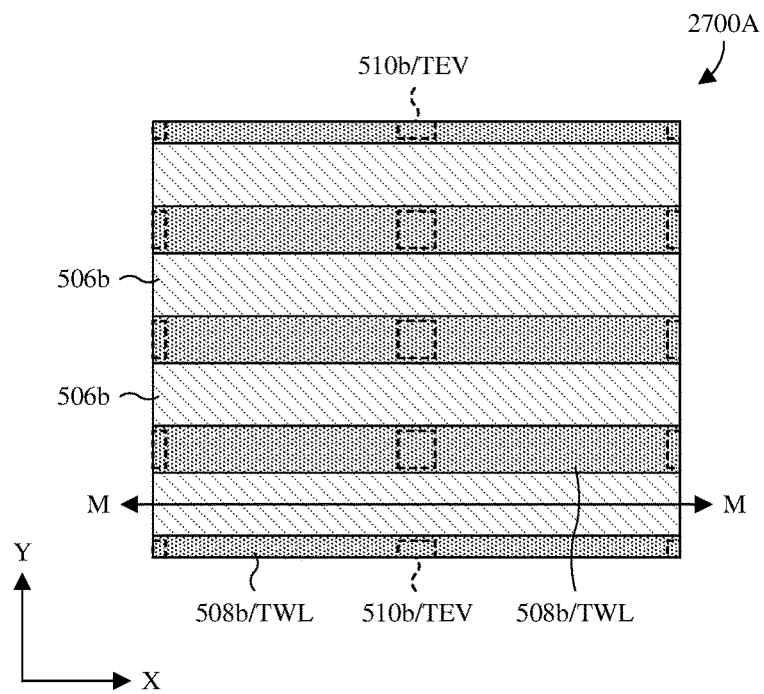
Figure 27B:
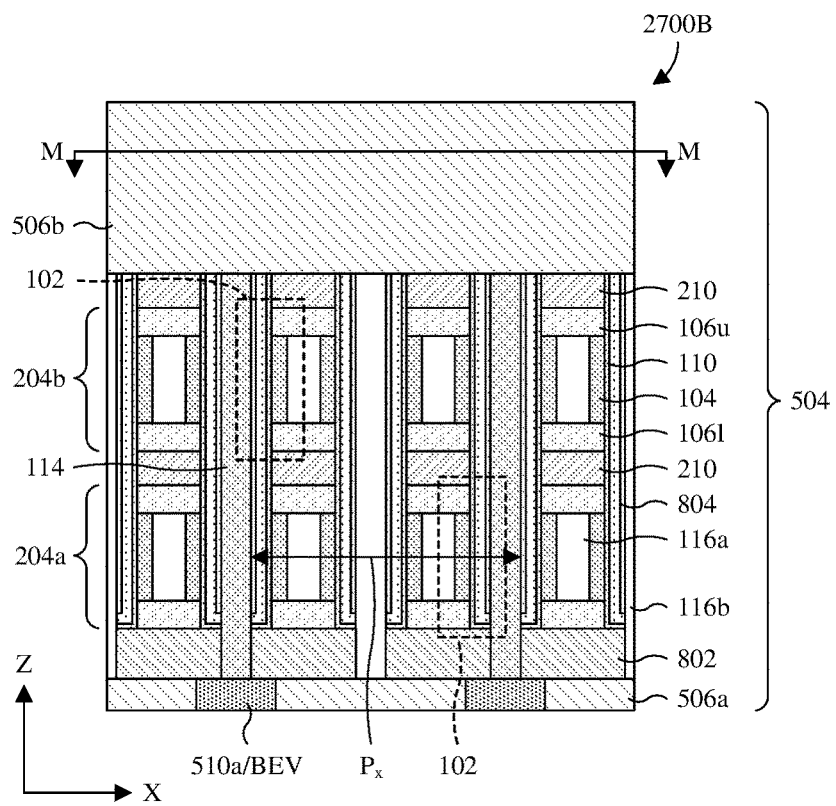

As illustrated by the top and cross-sectional views 2700A, 2700B of FIGS. 27A and 27B, the interconnect structure 504 is completed as described at FIGS. 18A and 18B. However, in contrast with FIGS. 18A and 18B, top word lines TWL and top electrode vias TEV are formed at even numbered rows or odd numbered rows, but not both.

While FIGS. 20A and 20B through FIGS. 27A and 27B are described with reference to various embodiments of a method, it will be appreciated that the structures shown in FIGS. 20A and 20B through FIGS. 27A and 27B are not limited to the method but rather may stand alone separate of the method. While FIGS. 20A and 20B through FIGS. 27A and 27B are described as a series of acts, it will be appreciated that the order of the acts may be altered in other embodiments. While FIGS. 20A and 20B through FIGS. 27A and 27B illustrate and describe as a specific set of acts, some acts that are illustrated and/or described may be omitted in other embodiments. Further, acts that are not illustrated and/or described may be included in other embodiments.

Figure 28:
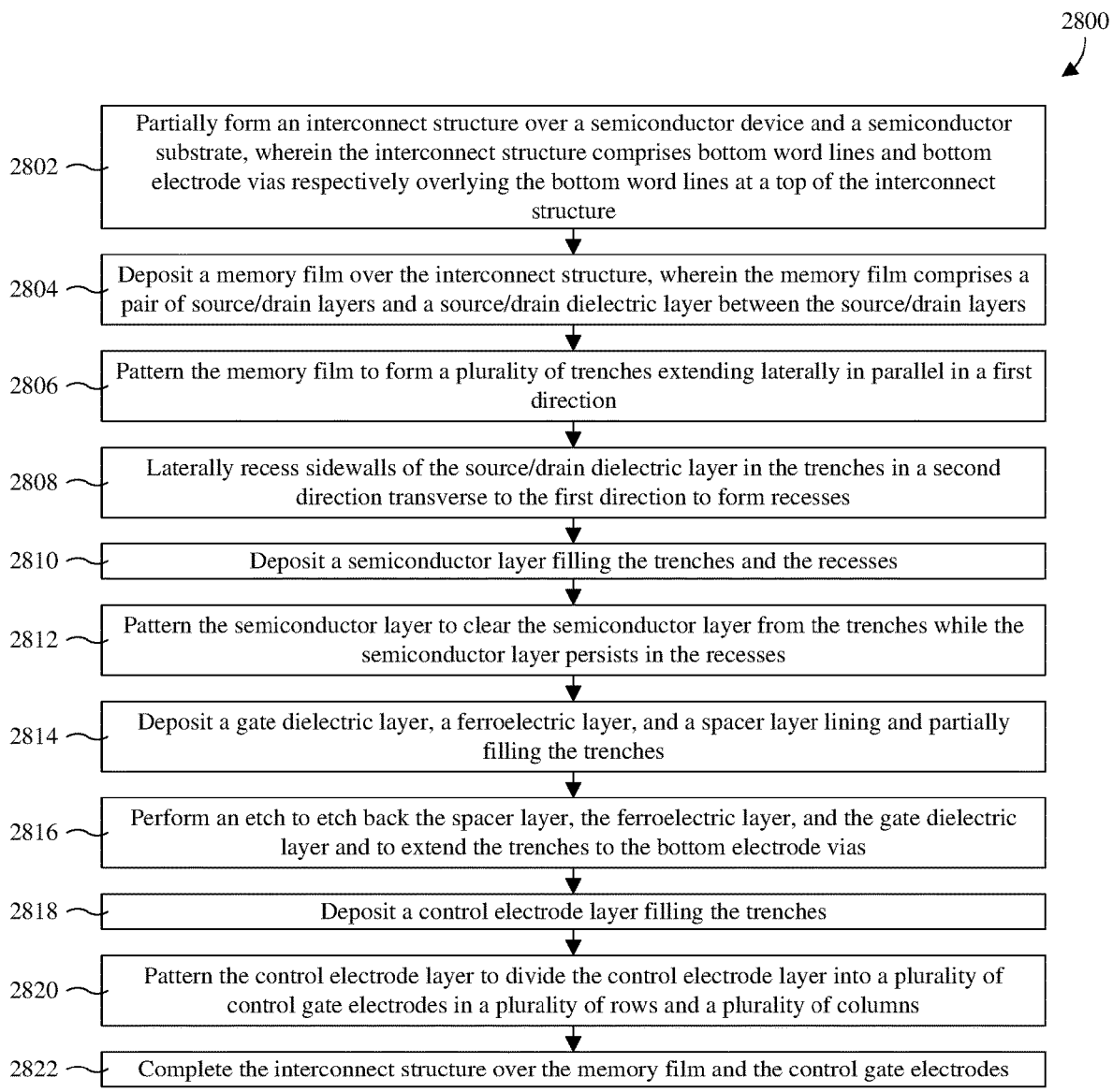
FIG. 28 illustrates a block diagram of some embodiments of the method of FIGS. 20A and 20B through FIGS. 27A and 27B.

With reference to FIG. 28, a block diagram 2800 of some embodiments of the method of FIGS. 20A and 20B through FIGS. 27A and 27B is provided.

At 2802, an interconnect structure is partially formed over a semiconductor device and a semiconductor substrate, wherein the interconnect structure comprises bottom word lines and bottom electrode vias respectively overlying the bottom word lines at a top of the interconnect structure. See, for example, FIGS. 20A and 20B.

At 2804, a memory film is deposited over the interconnect structure, wherein the memory film comprises a pair of source/drain layers and a source/drain dielectric layer between the source/drain layers. See, for example, FIGS. 21A and 21B and FIGS. 10A and 10B.

At 2806, the memory film is patterned to form a plurality of trenches extending laterally in parallel in a first direction. See, for example, FIGS. 21A and 21B and FIGS. 11A and 11B.

At 2808, sidewalls of the source/drain dielectric layer are laterally recessed in the trenches in a second direction transverse to the first direction to form recesses. See, for example, FIGS. 21A and 21B and FIGS. 12A and 12B.

At 2810, a semiconductor layer is deposited filling the trenches and the recesses. See, for example, FIGS. 21A and 21B and FIGS. 13A and 13B.

At 2812, the semiconductor layer is patterned to clear the semiconductor layer from the trenches while the semiconductor layer persists in the recesses. See, for example, FIGS. 21A and 21B and FIGS. 14A and 14B.

At 2814, a gate dielectric layer, a ferroelectric layer, and a spacer layer are deposited lining and partially filling the trenches. See, for example, FIGS. 22A and 22B.

At 2816, an etch is performed to etch back the spacer layer, the ferroelectric layer, and the gate dielectric layer and to extend the trenches to the bottom electrode vias. See, for example, FIGS. 23A and 23B.

At 2818, a control electrode layer is deposited filling the trenches. See, for example, FIGS. 24A and 24B.

At 2820, the control electrode layer is patterned to divide the control electrode layer into a plurality of control gate electrodes in a plurality of rows and a plurality of columns. See, for example, FIGS. 25A and 25B.

At 2822, the interconnect structure is completed over the memory film and the control gate electrodes. See, for example, FIGS. 26A and 26B and FIGS. 27A and 27B.

While the block diagram 2800 of FIG. 28 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present disclosure provides a memory device including: a lower source/drain region and an upper source/drain region overlying the lower source/drain region; a semiconductor channel that overlies the lower source/drain region and that underlies the upper source/drain region; a control gate electrode extending along a sidewall of the semiconductor channel and along individual sidewalls of the lower and upper source/drain regions; and a gate dielectric layer and a ferroelectric layer separating the control gate electrode from the semiconductor channel and the lower and upper source/drain regions. In some embodiments, the semiconductor channel is completely and laterally between opposite sidewalls of the upper source/drain region, wherein the opposite sidewalls respectively face and face away from the control gate electrode. In some embodiments, the control gate electrode is fully uncovered by the upper source/drain region. In some embodiments, the sidewall of the semiconductor channel is offset from the individual sidewalls of the lower and upper source/drain regions. In some embodiments, the ferroelectric layer extends along the sidewall of the semiconductor channel from top to bottom and further extends along the individual sidewalls of the lower and upper source/drain regions from top to bottom. In some embodiments, the memory device further includes a second semiconductor channel and a source/drain dielectric layer overlying the lower source/drain region and underlying the upper source/drain region, wherein the source/drain dielectric layer is between the semiconductor channel and the second semiconductor channel. In some embodiments, the memory device further includes a second semiconductor channel bordering the control gate electrode on an opposite side of the control gate electrode as the semiconductor channel, wherein the ferroelectric layer and the gate dielectric layer wrap around a bottom of the control gate electrode and separate the control gate electrode from the second semiconductor channel.

In some embodiments, the present disclosure provides another memory device including: a first semiconductor channel; a second semiconductor channel overlying the first semiconductor channel; and a control gate electrode and a ferroelectric layer bordering the first and second semiconductor channels, wherein the ferroelectric layer separates the control gate electrode from the first and second semiconductor channels. In some embodiments, the memory device further includes a high k gate dielectric layer separating the ferroelectric layer from the first and second semiconductor channels. In some embodiments, the control gate electrode, the ferroelectric layer, and the first semiconductor channel partially define a MFIS FET. In some embodiments, the memory device further includes a second control gate electrode laterally spaced from the control gate electrode and also bordering the first and second semiconductor channels, wherein the ferroelectric layer separates the second control gate electrode from the first and second semiconductor channels. In some embodiments, the memory device further includes a lower source/drain region and an upper source/drain region that are vertically stacked with the second semiconductor channel. In some embodiments, the upper source/drain region completely covers the first and second semiconductor channels. In some embodiments, the control gate electrode bulges individually at the first and second semiconductor channels.

In some embodiments, the present disclosure provides a method for forming a memory device, the method including: depositing a memory film over a substrate, wherein the memory film includes a pair of source/drain layers and a source/drain dielectric layer between the source/drain layers; performing a first etch into the memory film to form a trench through memory film; recessing a sidewall of the source/drain dielectric layer relative to sidewalls of the source/drain layers through the trench to form a recess; depositing a semiconductor layer filling the recess and the trench; performing a second etch into the semiconductor layer to clear the semiconductor layer from the trench; depositing a ferroelectric layer lining the trench and further lining the semiconductor layer at the recess; and depositing an electrode layer filling the trench over the ferroelectric layer. In some embodiments, the method further includes performing a third etch into the electrode layer to form a plurality of control gate electrodes bordering the semiconductor layer at the recess. In some embodiments, the method further includes depositing a high k gate dielectric layer lining the trench between the depositing of the semiconductor layer and the depositing of the ferroelectric layer. In some embodiments, the semiconductor layer is deposited on the sidewall of the source/drain dielectric layer and the sidewalls of the source/drain layers, wherein the semiconductor layer is cleared from the sidewalls of the source/drain layers but not the sidewall of the source/drain dielectric layer by the second etch. In some embodiments, the method further includes depositing a second memory film over the memory film, wherein the second memory film includes a pair of second source/drain layers and a second source/drain dielectric layer between the second source/drain layers, wherein the first etch is also performed into the second memory film, and wherein the recessing recesses a sidewall of the second source/drain dielectric layer relative to sidewalls of the second source/drain layers through the trench to form a second recess simultaneous with the recess. In some embodiments, the recessing recesses a second sidewall of the source/drain dielectric layer relative to second sidewalls of the source/drain layers through the trench to form a second recess, and wherein the second recess is on an opposite side of the trench as the recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a memory device, the method comprising:

depositing a memory film over a substrate, wherein the memory film comprises a pair of source/drain layers and a source/drain dielectric layer between the source/drain layers;

performing a first etch into the memory film to form a trench through the memory film;

recessing a sidewall of the source/drain dielectric layer relative to sidewalls of the source/drain layers through the trench to form a recess;

depositing a semiconductor layer filling the recess and the trench;

performing a second etch into the semiconductor layer to clear the semiconductor layer from the trench;

depositing a ferroelectric layer lining the trench and further lining the semiconductor layer at the recess; and depositing an electrode layer filling the trench over the ferroelectric layer.

2. The method according to claim 1, further comprising:
performing a third etch into the electrode layer to form a plurality of control gate electrodes bordering the semiconductor layer at the recess.

3. The method according to claim 1, further comprising:
depositing a high k gate dielectric layer lining the trench between the performing of the second etch and the depositing of the ferroelectric layer.

4. The method according to claim 1, wherein the semiconductor layer is deposited on the sidewall of the source/drain dielectric layer and the sidewalls of the source/drain layers, and wherein the semiconductor layer is cleared from the sidewalls of the source/drain layers but not the sidewall of the source/drain dielectric layer by the second etch.

5. The method according to claim 1, further comprising:
depositing a second memory film over the memory film, wherein the second memory film comprises a pair of second source/drain layers and a second source/drain dielectric layer between the second source/drain layers, wherein the first etch is also performed into the second memory film, and wherein the recessing recesses a sidewall of the second source/drain dielectric layer relative to sidewalls of the second source/drain layers through the trench to form a second recess simultaneous with the recess.

6. The method according to claim 1, wherein the recessing recesses a second sidewall of the source/drain dielectric layer relative to second sidewalls of the source/drain layers through the trench to form a second recess, and wherein the second recess is on an opposite side of the trench as the recess.

7. A method for forming a memory device, the method comprising:
depositing a memory film over a substrate, wherein the memory film comprises a pair of source/drain layers and a source/drain dielectric layer between the source/drain layers;
patterning the memory film to form a trench through the memory film, wherein the source/drain layers and the source/drain dielectric layer form a common sidewall in the trench;
forming a semiconductor channel inset into the common sidewall, between the source/drain layers, and exposed from the trench;
depositing a data storage layer and a gate dielectric layer lining the semiconductor channel in the trench, wherein the data storage layer is in an orthorhombic phase and is distinct from the gate dielectric layer; and
depositing an electrode layer in the trench and separated from the semiconductor channel by the data storage layer and the gate dielectric layer.

8. The method according to claim 7, wherein the forming of the semiconductor channel comprises:
performing a wet etch into the source/drain dielectric layer, through the trench, to form a recess at the source/drain dielectric layer;
depositing a semiconductor layer lining the trench and the recess; and
performing a dry etch into the semiconductor layer to segment the semiconductor layer into a plurality of semiconductor channels, including the semiconductor channel.

9. The method according to claim 8, wherein the pair of source/drain layers comprises a first source/drain layer and a second source/drain layer overlying the first source/drain layer, and wherein a portion of the semiconductor layer corresponding to the semiconductor channel underlies the second source/drain layer during the dry etch.

10. The method according to claim 7, further comprising:
performing a planarization into the electrode layer to a top surface of the data storage layer; and
patterning the electrode layer to form a plurality of openings extending through a portion of the electrode layer in the trench, wherein the openings segment the portion of the electrode layer into a plurality of electrodes in the trench.

11. The method according to claim 7, wherein the patterning of the memory film forms a second trench through the memory film, and wherein the data storage layer, the gate dielectric layer, and the electrode layer are further deposited in the second trench.

12. The method according to claim 11, further comprising:
patterning the electrode layer to form a plurality of first electrodes spaced from each other in the trench in a dimension, and to further form a plurality of second electrodes spaced from each other in the second trench in the dimension, and wherein the first and second electrodes alternate in the dimension.

13. The method according to claim 7, wherein the source/drain layers and the source/drain dielectric layer form a second common sidewall in the trench and on an opposite side of the trench as the common sidewall, and wherein the method further comprises:
forming a second semiconductor channel inset into the second common sidewall, between the source/drain layers, and exposed from the trench.

14. A method for forming a memory device, the method comprising:
depositing a memory film over a substrate, wherein the memory film comprises a pair of source/drain layers and a source/drain dielectric layer between the source/drain layers;
performing a first etch into the memory film to form a trench through the memory film;
performing a second etch into the source/drain dielectric layer through the trench to expand a width of the trench at the source/drain dielectric layer relative to a width of the trench at the source/drain layers;
forming a pair of semiconductor channels in the trench, wherein the semiconductor channels border the source/drain dielectric layer respectively on opposite sides of the trench and are at the expanded width of the trench;
depositing a ferroelectric layer lining the trench and further lining the semiconductor channels; and
depositing an electrode layer between and bordering the semiconductor channels in the trench, wherein the ferroelectric layer separates the electrode layer from the semiconductor channels.

15. The method according to claim 14, further comprising:
depositing a cap dielectric layer overlying a via, wherein the memory film is deposited overlying the cap dielectric layer;
depositing a spacer layer lining the trench over the ferroelectric layer; and
etching back the ferroelectric layer and the spacer layer to extend the trench through the cap dielectric layer to the via, wherein the electrode layer is deposited after the etching back.

16. The method according to claim 15, wherein the cap dielectric layer is deposited over a second via, which is electrically shorted to the via by a wire underlying the via and the second via, wherein the first etch forms a second trench through the memory film, wherein the ferroelectric layer and the spacer layer are deposited lining the second trench, and wherein the etching back extends the second trench to the second via.

17. The method according to claim 14, further comprising:
depositing a high k dielectric layer lining the trench, wherein the ferroelectric layer is deposited over the high k dielectric layer.

18. The method according to claim 14, further comprising:
depositing a second memory film over the memory film, wherein the second memory film comprises a pair of second source/drain layers and a second source/drain dielectric layer between the second source/drain layers;
wherein the first etch is further into the second memory film, such that the trench extends through the second memory film, and wherein the second etch expands a width of the trench at the second source/drain dielectric layer relative to a width of the trench at the second source/drain layers.

19. The method according to claim 14, wherein the forming of the pair of semiconductor channels comprises:
depositing a semiconductor layer filling the trench; and
performing a third etch into the semiconductor layer to segment the semiconductor layer into the pair of semiconductor channels, wherein a top source/drain layer of the pair of source/drain layers overlies portions of the semiconductor layer corresponding to the semiconductor channels during the third etch.

20. The method according to claim 14, further comprising:
performing a third etch into the electrode layer to form a plurality of openings extending through a portion of the electrode layer in the trench, wherein the openings segment the portion of the electrode layer into a plurality of electrodes in the trench; and
filling the openings with a dielectric material.

* * * * *